(12) United States Patent
Coffeen

(10) Patent No.: US 6,369,582 B2
(45) Date of Patent: Apr. 9, 2002

(54) SYSTEM AND METHOD FOR OFF-LINE IMPULSE FREQUENCY RESPONSE ANALYSIS TEST

(75) Inventor: Larry T. Coffeen, Jackson, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/848,861

(22) Filed: May 3, 2001

Related U.S. Application Data

(60) Provisional application No. 60/202,349, filed on May 5, 2000.

(51) Int. Cl.[7] .............................................. G01R 31/06
(52) U.S. Cl. ...................................................... 324/547
(58) Field of Search ................................ 324/547, 73.1, 324/117 H, 127; 323/357, 358; 361/35, 603, 623

(56) References Cited

U.S. PATENT DOCUMENTS

| 4,857,856 A | 8/1989 | Coleman et al. ............. 324/547 |
| 5,087,885 A | 2/1992 | Bergstrom ................... 324/547 |
| 5,455,506 A | 10/1995 | Mimeault et al. ........... 324/547 |

OTHER PUBLICATIONS

Working Copy of Proceedings, International Symposium on Digital Techniques in High–Voltage Measurements, Toronto, Canada, Oct. 28–30, 1991, CIGRE Study Committee 33, WG 03, IEEE Power Engineering Society, Power Systems Instrumentation and Measurements Committee.

Example of State–Of–The Art–Public Doman, Feb. 22, 2000, Substation Equipment Diag. Conference VIII, Comparison of Two FRA Methods to Detect Transformer Winding Movement, R.J. Denis, S.K. An, Bonneville Power Administration, Vancouver, Washington, J. Vandermaar, M. Wang, Powertech Labs, Vancouver, British Columbia.

*Primary Examiner*—Safet Metjahic
*Assistant Examiner*—J. Kerveros
(74) *Attorney, Agent, or Firm*—Thomas, Kayden, Horstemeyer & Risley, L.L.P.

(57) ABSTRACT

The winding testing unit provides a system and method for determining a characteristic signature of a winding residing in a device, such as a transformer or generator. A pulse/signal generator applies a suitable number of non-precise and non-identical pulses to the winding. A sensor detects output pulses after each applied input pulse has propagated through the winding. Data corresponding to the applied input and the detected output pulses are stored as data pairs in a memory. The processor executes logic to compute the auto-spectral density (Gxx) and the cross-spectral density (Gxy) for the data pairs. The logic then computes the characteristic signature, H(f), for the winding such that H(f) equals the average of Gxy divided by the average of Gxx for the data pairs. Comparison of the characteristic signatures over a period of time indicates winding deformation or displacement during the time period.

38 Claims, 11 Drawing Sheets

SYSTEM AND METHOD FOR OFF-LINE IMPULSE FREQUENCY RESPONSE ANALYSIS TEST

CLAIM OF PRIORITY

This document claims priority to and the benefit of the filing date of co-pending and commonly assigned provisional application entitled "The Application Of An Off-Line Power Transformer Low Voltage Impulse Frequency Response Analysis (LVIFRA) Technique Using Spectral Density Estimates Calculations And A Non-Recurrent Surge Pulse Source," assigned Ser. No. 60/202,349, filed May 5, 2000, which is hereby incorporated herein by reference.

CROSS-REFERENCE TO RELATED APPLICATIONS

This application is related to co-pending and commonly assigned U.S. patent application entitled "SYSTEM AND METHOD FOR ON-LINE IMPULSE FREQUENCY RESPONSE ANALYSIS TEST" filed on even date herewith which is entirely incorporated herein by reference.

TECHNICAL FIELD

The present invention relates generally to energy delivery systems, and more particularly, to a system and method for testing winding and winding connection displacements in a transformer.

BACKGROUND OF THE INVENTION

Electric utilities and other organizations are responsible for supplying an economic, reliable and safe source of electricity. Three major components are employed in an energy delivery system to provide the electricity to the end user, the generator, the transmission line and the transformer.

Generators are rotating machines operated in a manner such that electricity is created when mechanical energy is used to rotate the generator shaft. A generator rotor is coupled to the shaft, and when the shaft is rotated, thereby rotating the rotor, a voltage and current is caused in the generator stator. One typical form of mechanical energy used to generate electricity is steam, which is passed through a turbine that forces the generator shaft to rotate. Steam is often created by boiling water using coal, natural gas or nuclear fission heat sources. Or, steam may be taken directly from naturally occurring geothermal sources. Other sources of mechanical power employed for rotating a generator rotor may also include hydroelectric power or wind power. Since the end user of the electricity is rarely located near a generator, the electricity generated by the generator must be "transported" to the end user.

The second major component employed in an energy delivery system is the transmission line. Transmission lines consist of a grouping of wires which connect the generator to the end user. The "amount" of electricity that a transmission line can carry depends primarily upon the diameter of and number of the conductors (wires) used on the transmission line, and the voltage at which the transmission line is operated at. Typically, transmission lines from the generators employ a relatively high voltage so that a large amount of electricity is economically and reliably transported over long distances to locations where large concentrations of end users are found, such as a city or a large industrial manufacturing plant. Examples of extra high voltage (EHV) and intermediate transmission voltages employed in the industry include, but are not limited to, 500 kilo-volts (kV), 230 kV, 138 kV, 115 kV, 69 kV and 46 kV. Typically, lower transmission line voltages are employed on the transmission line distribution system (such as, but not limited to, 25 kV, 20 kV, 13.8 kV, 12 kV, 4 kV, 480 V and 240 V) to provide energy to the end user's premises connection point.

The third major component employed in an energy delivery system is the transformer. The transformer is a device that changes voltage. Generally, voltage from the generator is a lower voltage than used by the transmission lines that transmit the electricity to the end user. Furthermore, the voltage used by the end user is much lower than voltage than used by the transmission lines. Thus, the transformer couples elements of an energy delivery system that employ different voltages.

For example, two voltages typically found in a home are 240 volts and 120 volts. An EHV 500 kV transmission line may be delivering power to a city that employs a 230 kV transmission line system to deliver energy to a 13.8 kV distribution system. A 500/230 kV transformer changes voltage from 500 kV to 230 kV, thereby allowing two transmission lines having different operating voltages (500 kV and 230 kV) to be coupled together. Such a transformer has at least two terminals, a 500 kV terminal and a 230 kV terminal. Similarly, a 13.8 kV/240V/120V transformer may be used to convert voltage of the 13.8 kV distribution system to a voltage used in the end user's home or office. Thus, transformers allow the various voltage generators, transmission lines and distribution lines to be coupled to a home, office or other facility where the end user will be using the electricity.

Transformers come in many different sizes, shapes and constructions. Typically, transformer size (rating) is specified as the product of the maximum voltage and current, as measured from one side of the transformer, that the transformer is capable of converting at a particular operating condition. Such operating conditions include temperature and/or altitude. For example, a 500/230 kV transformer may be rated at 300 MVA (3,000 kilo-volt-amps) when operating at sea level and at 65° Celsius rise above ambient. Transformers may be constructed as separately insulated winding transformers or auto transformers, and as single phase or multiple phase transformers. The operating voltages, ratings and winding types of transformers employed in the industry, well known to one skilled in the art, are too numerous to describe in detail here other than to the extent necessary to understand the present deficiencies in the prior art.

All transformers, independent of size, rating and operating voltage, have several common characteristics. First, the transformer is constructed from one or more windings, each winding having a plurality of individual coils arranged and connected in an end-to-end fashion. In some transformers, the winding is made by wrapping a wire around a laminated solid member, called a core. Alternatively, there may be no core. However, in all transformers, the individual windings must be electrically isolated from each other. An insulation material is wrapped around the wires such that when the plurality of coils are made, the metal wires of each winding are physically and electrically separated, or insulated, from each other. Insulation materials wrapped around the windings may vary. Paper, impregnated with oil, is often used. Other types of transformers may use only paper, or may use another suitable material such as a polymeric compound.

Maintaining the electrical insulation between the windings is absolutely essential for the proper operation of a transformer. In the event that the electrical insulation is breached, such that electricity passes from one winding coil across the breach to another winding coil, special protective devices will operate to disconnect the transformer from the electrical system. The devices, by removing electricity applied to the transformer, interrupt the undesirable current flow through the insulation breach to minimize damage to the transformer. This condition is commonly referred to in the industry as a transformer fault.

Transformer faults are undesirable for at least two major reasons. First, end users may become separated from the energy delivery system, thereby loosing their electrical service. Second, transformer faults may result in large magnitudes of current flow, known as fault current, across the breach and through the transformer windings. Also, faults occurring on the energy delivery system at locations relatively close to the transformer may result in large fault currents flowing through the transformer. Often, fault current may be orders of magnitude greater than the highest level of normal operating current that the transformer was designed to carry. Such fault currents may cause severe physical damage to the transformer. For example, a fault current may physically bend portions of the transformer winding (winding deformation) and/or move the windings out of their original position in the transformer (winding displacement). Such winding deformation and/or displacement can cause over-voltage stresses on portions of the winding insulation and exacerbate the process of the naturally occurring deterioration of the winding insulation that occurs over a period of time. The fault current may further increase damage to the insulation, or damage insulation of adjacent windings, thereby increasing the magnitude and severity of the fault. In the most extreme cases, the fault current may cause an ignition in the transformer oil, resulting in a breach of the transformer casing and a subsequent fire or explosion.

Therefore, it is desirable to ensure the integrity of the transformer winding insulation. Once a transformer fault occurs, it is usually too late to minimize transformer damage and to reduce the period of electrical outage. The electric utility industry takes a variety of precautionary steps to ensure the integrity of winding insulation in transformers. One important precautionary step includes periodic testing of the transformer. Various tests are used to predict a probability of a future fault. One test commonly employed in the industry to detect winding deformation and/or displacement is the low voltage impulse test.

To perform a low voltage impulse test according to prior art methods, an electrical pulse or signal is applied to one terminal of a transformer. That is, a signal or pulse is applied to the input winding of the transformer. The signal or pulse on the output side of the transformer (output winding) is then measured. The input and output signals or pulses are analyzed using a variety of techniques. One analysis technique is to perform a frequency response analysis (FRA) which measures one characteristic of the input and output signals over a predetermined frequency range. One commonly employed technique is to process the measured input and output signals or pulses by applying a fast Fourier transform (FFT) to the signals. The FFT of the output signal is divided by the FFT of the input signal and the resultant admittance, as a function of frequency, may be plotted for the transformer. The input signal or input pulse may be applied to the high voltage, low voltage, neutral or other suitable terminal that is available on the transformer. The output signal is taken from another selected terminal on the transformer. For example, a low voltage pulse is applied to the high voltage terminal of the transformer winding and the output pulse is measured on the low voltage terminal of the transformer.

Such a test is commonly known as a low voltage impulse test because the voltage of the applied input signal or pulse is much less than the impulse voltages used to test for dielectric integrity in a high voltage laboratory or at the transformer manufacturing site. When a series of identical pulses or signals are applied to the transformer winding, in accordance with prior art transformer testing procedures, and the resultant measurements are averaged together, the resultant plot is often referred to as the transfer function or characteristic signature of the transformer winding configuration being tested.

In a static situation, a test engineer could reasonably expect that the characteristic signature of the transformer winding would not significantly change with time. For example, the test engineer could reasonably expect that a transformer winding tested one year after being placed in service, assuming that nothing has changed within the transformer during that year, could be tested and have output measurements that would substantially match the output measurements taken a year earlier.

However, static conditions rarely occur in the field. Each time current flow is adjusted in the transformer, mechanical stress in the windings change. Abrupt changes in current flow can occur every time a portion of the electrical transmission system is reconfigured by switching, or every time lightning strikes the transmission system nearby the transformer. Many other events may also cause abrupt changes in current through the transformer on a regular and frequent basis. This is a basic reality of the operation of the electric system. Transformer windings are designed to accommodate a number of reasonable magnitudes of abrupt current change over the operating life of the transformer. Yet, abrupt current changes in excess of the design limits are occasionally encountered. When these conditions occur, the windings may permanently bend from their original position, hereinafter referred to as winding deformation. Or, the windings may move slightly from their originally installed position, hereinafter referred to as winding displacement. Winding deformation and displacement may stress, crack and/or otherwise impair the insulation around the windings. Furthermore, the impairment caused to the winding insulation by each abrupt change in current is cumulative. That is, the damage is not self-repairing or healing. Eventually, the damage may become sufficient to cause a breach in the insulation. Then, a fault will occur and the transformer will become damaged, thereby requiring the transformer to be taken out of service for repair or retirement.

Additionally, winding deformation and/or displacement may alter the voltage gradient around the bent portion of the coils. If the winding deformation and/or displacement decreases the gap between two adjacent winding coils, the voltage gradient may become more concentrated around the bend. The increase in the voltage gradient may be sufficient, over a short or long period of time, to breach the insulation, thereby causing a fault. Or, the increased voltage gradient may cause a temperature increase around the deformed and/or displaced portion of the coils. The increased temperature increases the rate of degradation of the winding insulation. In an oil filled transformer, the temperature increase may alter the properties of the transformer oil, and possibly result in electrical partial discharge which in turn results in the formation of undesirable gasses.

Thus, periodic testing is performed to determine and/or estimate the amount of cumulative damage to the transformer resulting from the normal (and abnormal) day-to-day operating conditions that the transformer has been subjected to. If the tests indicate potential problems, the transformer can be scheduled for maintenance, or replaced if necessary, in a timely and controlled manner that results in the least disruption in service to the end users. Furthermore, transformers are very expensive pieces of equipment, thus repairing a transformer before permanent damage occurs is desirable.

Prior art low voltage impulse tests present many unique problems. One significant problem is that a precise, repeatable input testing signal or pulse of known energy content to be sufficient for the test must be applied to the input terminal of the tested transformer winding when prior art frequency response analysis techniques are used to measure the frequency response of the transformer winding. If the applied input test signals/pulses are not identical to each other, the resultant characteristic signature of the tested transformer windings will not be accurate. For example, the prior art has no objective test accuracy or bandwidth limit analysis, so an unknown pulse at the input will compromise the test result without detection. In addition, the time delay between pulse applications for the prior art should be constant to prevent random distortion of the input pulse which affects the characteristic signature. For example, if the pulse intervals are not constant, the energy storage remaining in the transformer winding configuration will be different between pulses, thus altering the load impedance of the transformer and therefore, changing the parameters (frequency energy content) of the applied pulse. Furthermore, test signal/pulse generators or test pulse generators capable of providing such exact and repetitive input signals or pulses are expensive.

Therefore, it is desirable to have a valid and reliable low voltage impulse testing system and method that does not require a plurality of identical input test signals/pulses for a single test. Also, it would be desirable for the test equipment to be inexpensive, to be easily portable, and to be easily implemented in the field where the transformer is located. Furthermore, it would be desirable to have the test signal/pulse generator configured to provide a wide variety of test signals/pulses suitable for testing a wide variety of transformers.

SUMMARY OF THE INVENTION

The present invention provides a system and method for determining a characteristic signature of a winding residing in a device. Briefly described, in architecture, the system and method can be implemented as follows.

The person conducting the test of the winding, hereinafter referred to as the testing personnel, prompts a pulse/signal generator to generate a pulse or signal that is applied to the winding which is to be tested. A sensor detects an output pulse or signal after the applied input pulse or signal has propagated through the winding. Data corresponding to the applied input pulse or signal, and data corresponding to the detected output pulse or signal, is stored in a memory. The testing personnel prompts the pulse/signal generator to apply a suitable number of additional pulses or signals as described above such that a data base of pairs of input and output pulses or signals are accumulated in the memory. For each of the subsequent applied input pulses or signals, the testing personnel may optionally actuate a pulse/signal width adjuster, and/or actuate a pulse/signal voltage adjuster, such that the nature (width and/or voltage) of the subsequently applied input pulses or signals are varied.

After a suitable number of input pulses or signals have been applied to the winding, the testing personnel prompts a processor to retrieve the stored data and to calculate a characteristic signature of the tested winding. The processor calculates the characteristic signature of the winding by executing logic employing a unique computational method. First, the auto-spectral density (Gxx) is calculated. Gxx is defined by the complex conjugate of the fast Fourier transform (FFT) of the input pulse or signal times the FFT of the same impulse or signal. Second, the cross-spectral density (Gxy) is calculated. Gxy is defined by the complex conjugate of the FFT of the input pulse times the FFT of the output pulse. The logic then calculates the characteristic signature [H(f)] for the winding such that H(f) equals the average of the average of the Gxy's divided by the average of the Gxx's for the respective pairs of input and output pulses or signals. This H(f) is representation is chosen for noise rejection in the output signal, since the output signal is much smaller than the input signal. For example, only the output components which are correlated with the input pulse are accepted. Other components, such as, but not limited to, un-correlated output noise, are rejected by definition. Thus, a good signal to noise ratio for a relatively small signal in a relatively noisy environment is provided. In addition, equations using spectral densities (Gxx, Gxy and Gyy) can be determined when input pulses or signals that are slightly different, or even very different, from each other.

To verify the accuracy and validity of the calculated characteristic signature H(f) of the winding, a coherence function $\gamma^2_{xy}(f)$ is calculated, according to the equation below:

$$\gamma^2_{xy}(f)=|G_{xy}(f)|^2/G_{xx}(f)G_{yy}(f)$$

The coherence function $\gamma^2_{xy}(f)$ is a real valued function having a magnitude ranging from 0 to 1. A value of 1 would indicate a perfect linear relationship from the input pulse or signal to the detected output pulse or signal. A value of 0 would indicate a complete non-linear relationship between the input and detected output pulses or signals, or that there was not sufficient input energy in the applied pulse or signal to transfer sufficiently to the output. The coherence function is also sensitive to alaising on the input and output digital records. The coherence function will also indicate low numbers for high input pulse noise levels.

Additionally, a random error function $E_r|H(f)|$ is calculated, according to the equation below:

$$E_r|H(f)|=[1-\gamma^2_{xy}(f)]^{1/2}/|\gamma_{xy}(f)|(2n_d)^{1/2}$$

The random error, $E_r|H(f)|$, provides a statistical analysis of the test data and defines a 95% confidence interval for the test data that is graphed over a frequency range of interest. Such a graph plots two lines, with the spacing between the two lines indicating the 95% confidence interval for the test data. The error function indicates how well the test is performed from a first testing of the transformer winding and a second test on the same winding. For example, the value of the error function will increase significantly if there is a problem with the connections or the leads in one of the tests. The error function will not increase significantly for a change due to transformer winding deformation and/or displacement.

One embodiment of the winding testing unit includes logic that analyzes the coherence function and the random error function. Based upon pre-defined criteria, the comparison numbers may be displayed with a color coded system. For example, if the comparison displays a number in green, then little or no change has occurred between the two compared tests of the same transformer winding. If the comparison numbers are displayed in yellow, then the yellow color indicates that some change has occurred.

However, such changes denoted by the yellow color may be considered to be associated with temperature differences between the test, differing conditions of transformer oil between the tests, or normal aging of the insulation that occurs over a number of years. If the comparison numbers are displayed in red, an indication of a significant change in the tested winding is indicated. Should the comparison numbers be well into the red zone, the tested winding should be inspected and scheduled for possible repair in the near future. Thus, this embodiment of the winding testing unit is particularly well-suited for use by an individual who is not necessarily skilled in the art of analyzing transformer test results, such a technician or other maintenance personnel.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The winding test system and method, as defined in the claims, can be better understood with reference to the following drawings. The components within the drawings are not necessarily to scale relative to each other, emphasis instead being placed on clearly illustrating the principles of the winding test system and method.

Figure 1:
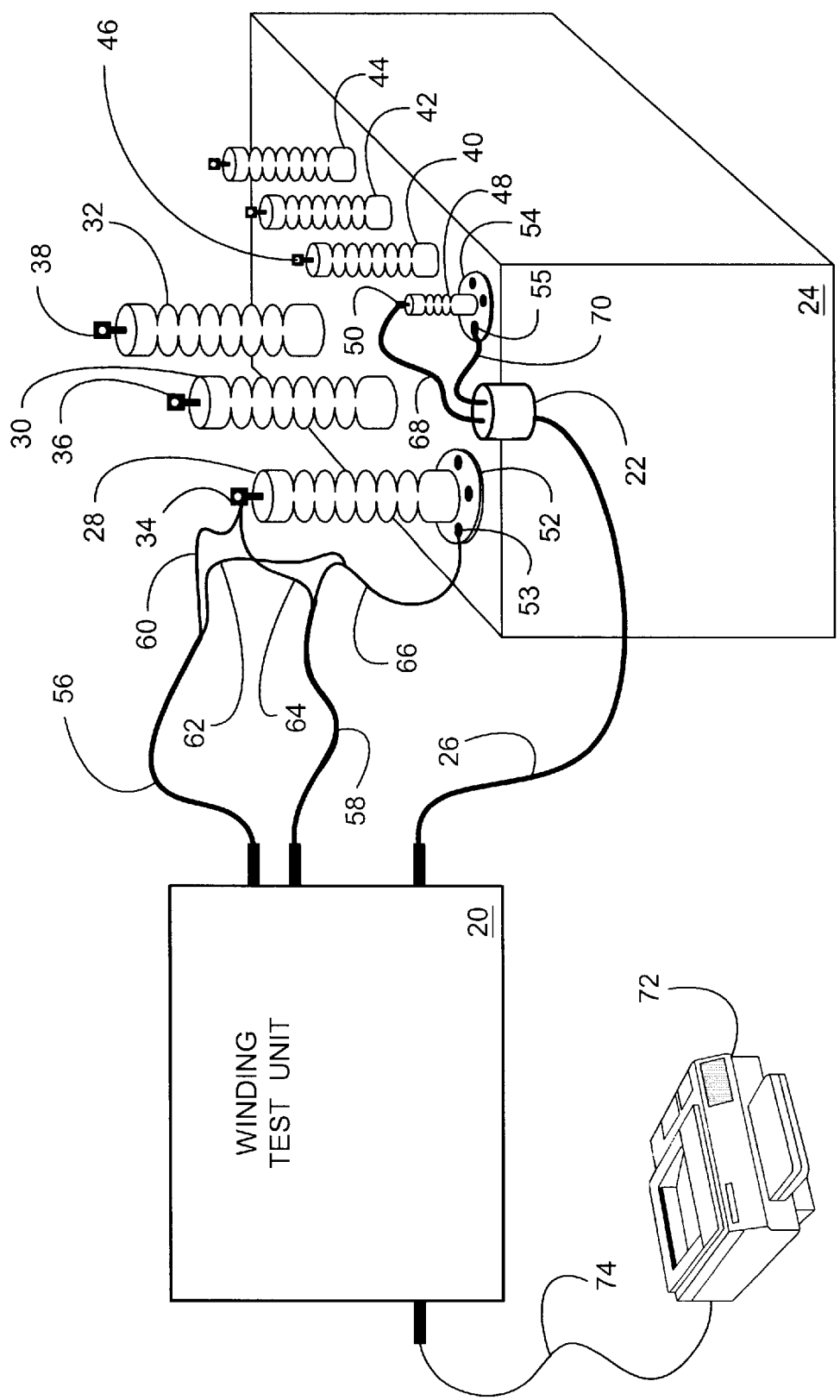
FIG. 1 is a simplified illustrative block diagram of the winding test unit and the sensing element of the present invention coupled to a transformer.

For convenience of illustration, elements among the several figures that are similar to each other may bear the same reference numerals. Such elements bearing the same reference numerals may be considered to be like elements; however, since these like numeraled elements are incidental to the operation of the present invention which utilizes existing portions of a communication network, one skilled in the art will realize that like numeraled elements among the several figures need not be identical, as any variations of such elements will not adversely affect the functioning and performance of the present invention. Furthermore, like elements that are like-numbered may be described in detail only in the first instance of occurrence, and not described in detail again when occurring in subsequent figures.

DETAILED DESCRIPTION OF THE INVENTION

A. Overview of the Transformer Testing System And Method

FIG. 1 is a simplified illustrative block diagram of the winding test unit 20 and the sensing element 22 of the present invention coupled to a transformer 24. Winding test unit 20 is coupled to sensing element 22 via connection 26. For convenience of illustration, sensing element 22 is shown residing outside of the winding test unit 20 as a separate element. Alternatively, sensing unit 22 could be included as an internal element residing within the winding test unit 20.

Transformer 24 is a well known voltage conversion device employed in energy delivery systems. For simplicity, detailed operation of the transformer 24, and many of the individual components associated with transformer 24 are not described in detail herein, other than to the extent necessary to understand the operation and functioning of transformer 24 when tested by the winding test unit 20. Thus, one skilled in the art will appreciate that the simplified diagram of transformer 24 illustrates only a few of the many transformer components residing on the outside of transformer 24 and none of the internal components residing inside transformer 24.

Transformer 24 is illustrated as having three high voltage bushings 28, 30 and 32. Each high voltage bushing 28, 30 and 32 has a corresponding terminal 34, 36 and 38 for coupling the high voltage side of transformer 24 to a high voltage portion the energy delivery system (not shown). Transformer 24 also includes three low voltage bushings 40, 42 and 44. Low voltage bushings 40, 42 and 44 each have a terminal 46 used to couple transformer 24 to a low voltage portion of the energy delivery system (not shown). A neutral bushing 48, having a terminal 50, also resides on transformer 24. As well known in the art, high voltage bushings 28, 30 and 32 have wire leads (not shown) which couple the terminals 34, 36 and 38 to the high voltage side of the windings (not shown) residing in transformer 24. Likewise, low voltage bushings 40, 42 and 44 have wire leads (not shown) coupling terminals 46 with the low voltage side of the windings (not shown) residing in transformer 24. Neutral bushing 48 also includes a wire connector coupling terminal 50 to an internal common grounding point (not shown) associated with the windings (not shown) residing in transformer 24. The above-described configuration and construction of the internal components of transformer 24 are well known in the art and are not described in further detail other than to the extent necessary to understand the operation and functioning of these components when tested by the winding test unit 20.

High voltage bushing 28 is mounted to transformer 24 with a mounting flange 52 that is fixably attached to the bottom of the high voltage bushing 28. Mounting flange 52 is securely affixed to the top of transformer 24 with a plurality of bolts 53, nuts or other similar attaching devices. Similarly, high voltage bushings 30 and 32, and low voltage bushings 40, 42 and 44 have similar mounting flanges (not shown) which affix the bushings to transformer 24. Neutral bushing 48 has a mounting flange 54 and is secured to transformer 24 with bolts 55 or the like.

The transformer 24 illustrated in FIG. 1 is commonly known as a three phase transformer. Thus, three high voltage bushings 30, 34 and 36 are coupled to the low voltage bushings 40, 42 and 44 via the windings (not shown) residing inside transformer 24. The nomenclature typically employed within the industry to identify the three phases are: phase A, phase B and phase C. Thus, a transformer 24 configured for a three phase operation would have one high voltage bushing and one low voltage bushing associated with phase A, a second high voltage bushing and a second low voltage bushing associated with phase B, and a third high voltage bushing and a third low voltage bushing associated with phase C. For example, high voltage bushing 28 and low voltage bushing 40 may be associated with phase A in transformer 24. Similarly, high voltage bushing 30 and low voltage bushing 42 may be associated with phase B and high voltage bushing 32 and low voltage bushing 44 may be associated with phase C.

Winding test unit 20, as illustrated in FIG. 1, is coupled to transformer 24 via connection 52 so that a pulse or signal generated by winding test unit 20 is applied to terminal 34 of high voltage bushing 28 in a manner described below. In one embodiment, connections 56 and 58 are coaxial cables. Alternative embodiments employ similarly suitable two wire connections. More specifically, a first connection 60, such as the center conductor of a coaxial cable 52, is coupled to terminal 34, thereby providing connectivity between connection 106 and terminal 34. A second connection 62, such as the shield wire of a coaxial cable 56 (or another wire coupled to the shield wire), is coupled to a convenient location on connection 66. Alternatively, connection 62 may be coupled to the mounting flange 52, preferably attached by coupling to a selected mounting bolt 53. Similarly, connection 58 has two wires, such as a coaxial cable in one embodiment. More specifically, a first connection 64, such as the center wire of a coaxial cable 58, is coupled to terminal 34 and a second connection 66, such as the shield wire of a coaxial cable 58, is coupled to mounting flange 52. Alternatively, connection 62 may be coupled to a convenient location on connection 66, and connection 62 may be coupled to mounting flange 52 using a selected mounting bolt 53. Thus, connections 62 and 66 form a path across high voltage bushing 28 that approximates the dry arching distance of the bushing insulation. In the embodiment illustrated in FIG. 1, the connection 60 residing in connection 56 transmits the generated pulse or signal to terminal 34, and is physically separate from connection 58 so that the applied pulse or signal is more accurately detected. Such techniques are well known in the art. However, alternative embodiments may employ a connection 58 coupled to other alternative convenient locations so that the generated pulse or signal applied to terminal 34 is detected.

Sensing element 22 is communicatively coupled to terminal 50 of the neutral bushing 48 via connection 68. Also, sensing element 22 is communicatively coupled to the neutral bushing mounting flange 54 via connection 70 to form a series path across the external insulation of the neutral bushing 48 in a manner that approximates the dry arching distance of the bushing insulation. In one embodiment, connections 62, 66 and 70 may be implemented with a low inductance connector such as, but not limited to, a flat copper braid, copper ribbon, or other suitable low inductance metallic connector. Using low inductance connectors insures that the transfer function, described below, is determined in a large part by the internal leads and the windings of transformer 24, and thereby minimizing the impact of the external connections used to couple the winding test unit 20 to transformer 24.

When a pulse or signal is generated by winding test unit 20 and applied to connection 60, the pulse or signal propagates through terminal 34, through the high voltage bushing 28, through the windings (not shown), and out to terminal 50 of the neutral bushing 48. A detector (not shown) residing in the winding test unit 20 detects the generated pulse or signal applied to terminal 34. Sensing element 22 detects the output pulse or signal on terminal 50. Sensing element 22 outputs a signal corresponding to the output pulse or signal detected at terminal 50 to the winding test unit 20 via connection 26. Summarizing, winding test unit 20 applies an input pulse or signal to terminal 34 and receives signals corresponding to the input pulse or signal at terminal 34 and the output pulse or signal at terminal 50.

Winding test unit 20 performs a variety of analytical analysis operations, described hereinafter, on the received input pulse or signal and the output pulse or signal to determine a new type of characteristic signature of transformer 24. Upon conclusion of the testing of transformer 24, winding test unit 20 provides a suitable output that is analyzed by a person skilled in the art of inspecting transformers.

For convenience, winding test unit 20 is illustrated as being coupled to printer 72 via connection 74. Thus, upon conclusion of the testing of transformer 24 and the associated analysis of the input and output pulses or signals, winding test unit 20 outputs one or more suitably formatted reports to printer 72 for printing. One skilled in the art will appreciate that the winding test unit 20 is configured to output any of a variety of suitable output signal formats. For example, another embodiment of winding test unit 20 is configured to provide output to a display screen such as a cathode ray tube (CRT) or other suitable display screen. Another embodiment of winding test unit 20 is configured to provide an output signal that is stored on a suitable storage media. Examples of suitable storage media include, but are not limited to, any one or combination of volatile memory elements (e.g., random access memory (RAM, such as DRAM, SRAM, etc.)) and nonvolatile memory elements (e.g., ROM, hard drive, tape, CDROM, etc.). Moreover, suitable storage media may incorporate electronic, magnetic, optical, and/or other types of storage media. Note that the suitable storage media can have a distributed architecture, where various components are situated remote from one another, but can be accessed by the winding test unit 20, either directly or indirectly. Such an embodiment of the winding test unit 20 would be particularly suitable for providing documentation of test results, for storing test results in a centralized location for future use, and/or for analyzing test results in additional detail.

Figure 2:
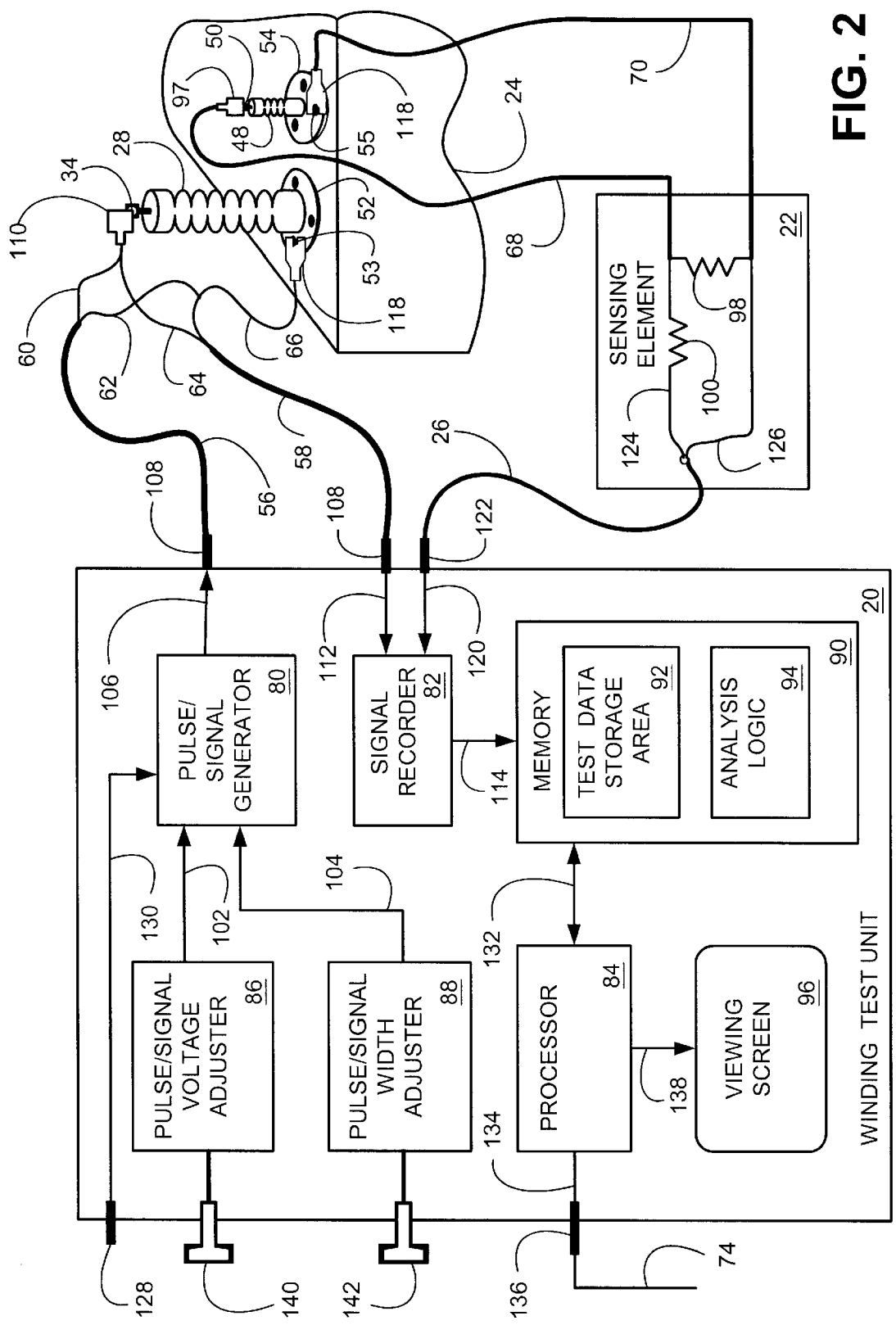
FIG. 2 is a block diagram illustrating selected components residing in the winding test unit and the sensing element of FIG. 1.

B. Selected Components Residing in a Preferred Embodiment of a Transformer Testing System And Method FIG. 2 is a block diagram illustrating selected components residing in the winding test unit 20 and the sensing element 22 of FIG. 1. Winding test unit 20 includes at least a pulse/signal generator 80, a signal recorder 82, a processor 84, a pulse/signal voltage adjuster 86, a pulse/signal width adjuster 88 and a memory 90. Memory 90 includes a test data storage area 92 and the analysis logic 94. An optional viewing screen 96 is also included with the winding test unit 20. Sensing element 22 includes a low inductance resistive element 98 and a series resistive element 100 to impedance match connection 26.

Pulse/signal generator 80 is configured to generate a pulse or signal. The magnitude of the pulse or signal generated by the pulse/signal generator 80 is specified by an input from the pulse/signal voltage adjuster 86, provided over connection 102, that specifies the peak voltage magnitude of the pulse or signal. The width of the pulse or signal generated by the pulse/signal generator 80 is determined by a signal from the pulse/signal width adjuster 88, over connection 104. Pulse/signal voltage adjuster 86 may be implemented using well known components and methods employed in the art of adjusting voltages. Similarly, pulse/signal width adjuster 88 may be implemented using well known components and methods employed in the art of adjusting the width of a pulse or signal. Detailed operation of individual components used in the pulse/signal voltage adjuster 86 and/or the pulse/signal width adjuster 88 are not described in detail herein, other than to the extent necessary to understand the operation and functioning of these components when employed as part of the winding test unit 20. One skilled in the art will realize that the pulse/signal voltage adjuster 86 and the pulse/signal width adjuster 88 may be implemented using any one of a number of well known devices and that such devices are too numerous to conveniently describe in detail herein. Any such well known devices which adjust voltage magnitude and/or adjust the width of a pulse or signal may be implemented in a winding test unit 20 without departing substantially from the functionality and operation of the present invention. Any such variations in a winding test unit 20 which utilizes the system and method of the present invention to generate a pulse or signal having a suitable voltage and a suitable width are intended to be within the scope of this disclosure and to be protected by the accompanying claims.

Based upon the voltage specified by the pulse/signal voltage adjuster 86 and the width of the pulse or signal specified by the pulse/signal width adjuster 88, pulse/signal generator 80 is prompted to generate a pulse or signal onto connection 106. Connection 106 of the winding test unit 20 is coupled to connection 56, thereby providing connectivity to terminal 34 of the high voltage bushing 28 on transformer 24. In one embodiment connection 56 is configured to couple to connection 106 with a commonly available plug-in attachment 108. Examples of plug-in attachment 108 include, but are not limited to, a commercially available banana plug, coaxial cable connector, alligator clip, lug or screw. Alternatively, connection 56 is fixably attached to connection 106, thereby providing a secure connection to connection 106. Connection 56 employs a releasable fastener 110 so that connection 56 is easily and conveniently coupled to terminal 34. Examples of a suitable releasable fastener 110 include, but are not limited to, a clamp, a bolt, a clasp, a c-clamp, or a specially designed and fabricated terminal connector.

Signal recorder 82 detects the pulse or signal generated by the pulse/signal generator 80, via connection 112, from terminal 34. In one embodiment, connection 58 is a connector of suitable length and flexibility that is configured to conveniently couple to connection 112 and to terminal 34. For example, connection 58 may be configured to couple with connection 112 with a commonly available plug-in attachment 108, as described above. Thus, an embodiment of the winding test unit 20 employing connection 58 provides for the detection of the pulse or signal that is applied to terminal 34, thereby avoiding the influence of any distortions that may be introduced by connections 106 and 56. An alternative embodiment directly detects the generated pulse or signal at an alternative convenient location, or directly from the pulse/signal generator 80. Signal recorder 82 transmits a suitable formatted data signal corresponding to the detected input and output pulses or signals to memory 90, via connection 114, for storage in the test data storage area 92.

Sensing element 22 is coupled to terminal 50 of the neutral bushing 48 as described below. Resistive element 98 residing in the sensing element 22 is coupled to terminal 50 of the neutral bushing 48 via connection 68 using a suitable connector, such as releasable fastener 97. Releasable fastener 97 is similar to releasable fastener 110 described above. Resistive element 98 is also coupled to mounting flange 54, via connection 70. A suitable connector 118 is used to provide a secure electrical connection between connection 68 and mounting flange 54. Connector 118 is shown as a spade-type connector particularly suitable for connecting to a readily accessible bolt 55, nut or the like residing on transformer 24. However, connector 118 may be any suitable connector that provides a secure electrical connection between connection 70 and mounting flange 54. Similarly, connections 66 and 62 are coupled to a selected mounting bolt 53 with a connector 118.

Furthermore, for convenience of illustration, connections 68 and 70 are illustrated as fixably attached to resistive element 98. Alternatively, connections 68 and/or 70 could be coupled to resistive element 98 using a suitable plug-in attachment similar to plug-in attachment 108 described above.

Connection 26 couples the series resistive element 100 residing in sensing element 22 to the winding test unit 20. Connection 26 is coupled to the winding test unit 20 with a suitable plug-in attachment 122. For convenience of illustration, connection 26 is illustrated as fixably attached to resistive element 100 via connections 124 and 126. Alternatively, connection 26 could be coupled to connections 124 and 126 using a suitable plug-in attachment similar to plug-in attachment 108 described above.

When connection 26 couples sensing element 22 to winding test unit 20, connection 124 is coupled to the sensing element 22 such that signal recorder 82, via connection 120, can detect and record signals from sensing element 22. Such detected signals are stored in the test data storage area 92.

Sensing element 22 is illustrated as having a shunt resistive element 98 and a series resistive element 100. In the preferred embodiment, resistive element 98 is a resistor having a resistance substantially equaling 10 Ohms. Series resistive element 100 is substantially equal to 75 Ohms in the preferred embodiment. Thus, the resistive elements 98 and 100 are configured to substantially match the impedance characteristics of connection 26 so that the output pulse or signal is accurately detected. One skilled in the art will appreciate that the values of resistive elements 98 and 100 may be selected so that the output pulse or signal detected at terminal 50 is suitably detected and so that a suitable output signal is provided over connection 26. One skilled in the art will realize that any number of suitable values and/or combinations of resistive elements 98 and 100 may be selected, and that such values and/or combinations are too numerous to conveniently describe in detail herein. Thus, any suitable combination of a resistive elements 98 and 100 that provides a suitable output signal on connection 26, may be implemented in a sensing element 22 without departing substantially from the functionality and operation of the present invention. Any such variations in a sensing element 22 coupled to a winding test unit 20 which utilizes the system and method of the present invention are intended to be within the scope of this disclosure and to be protected by the accompanying claims.

Processor 84 is coupled to memory 90 via connection 132, which may include one or more buses. Processor 84, as described hereinafter, accesses the analysis logic 94 residing in memory 90 and the recorded signals described above residing in the test data storage area 92 so that a new characteristic signature of transformer 24 may be determined. Processor output connection 134 is coupled to connection 74 so that a suitable output report may be provided to the testing personnel. For convenience of illustration, connection 134 is coupled to connection 74 with a plug-in attachment 136. Plug-in attachment 136 is similar to the plug-in attachment 108 described above. However, alternative embodiments may employ other types of connectors, or connection 134 may be fixably attached to connection 74, without departing substantially from the operation and functionality of the present invention.

Additionally, processor 84 is coupled to an optional viewing screen 96 via connection 138. The optional viewing screen 96 is used by the testing personnel to view the generated pulse or signal from pulse/signal generator 80, the signal corresponding to the detected output pulse or signal on terminal 50 of the neutral bushing 48, and/or the output reports generated by processor 84. Viewing screen 96 may be any suitable device for displaying an output signal. For example, but not limited to, viewing screen 96 may be a cathode ray tube (CRT), a flat panel screen, a light emitting diode (LED) screen, liquid crystal display (LCD), or any other well known screen device. A winding test unit 20 employing any suitable viewing screen embodiment is intended to be within the scope of this disclosure and protected by the accompanying claims.

Summarizing, when winding test unit 20 and sensing element 22 are coupled to transformer 24 as described above, a pulse or signal generated by pulse/signal generator 80 propagates through the transformer windings (not shown) and an output pulse or signal is detected by sensing element 22. A signal corresponding to the generated input pulse or signal and a signal corresponding to the detected output pulse or signal is provided to signal recorder 82 for storage in the test data storage area 92 on memory 90.

As described above, pulse/signal generator 80 is prompted to generate a pulse or signal onto connection 106. A person conducting a test using winding test unit 20 and sensing element 22, hereinafter referred to as the testing personnel, prompts pulse/signal generator 80 to generate a pulse or signal onto connection 106 by actuating actuator 128. Actuator 128 provides a signal over connection 130 to the pulse/signal generator 80 such that the pulse/signal generator 80 generates the desired pulse or signal. Actuator 128 may be implemented using any suitable type actuating device configured to generate a signal that is suitable for prompting pulse/signal generator 80 generate the desired pulse or signal. Examples of actuator 128 include, but are not limited to, push button switches, single pull-single throw switches, touch pads, touch sensors or other similar devices that respond to a command provided by the testing personnel. Any such well known actuator 128 may be implemented in a winding test unit 20 without departing substantially from the functionality and operation of the present invention. Any such variations in the device used to implement actuator 128 in a winding test unit 20 which utilizes the system and method of the present invention is intended to be within the scope of this disclosure and to be protected by the accompanying claims.

The testing personnel during the testing of transformer 24, as described in detail below, may elect to adjust the voltage of the pulse or signal generated by pulse/signal generator 80. An actuator 140, conveniently accessible from the outside of winding test unit 20, is coupled to the pulse/signal voltage adjuster 86 so that the testing personnel may adjust the voltage of the generated pulse or signal. In one embodiment, actuator 140 is a control dial. However, actuator 140 may be any other suitable device which enables the testing personnel to actuate the pulse/signal voltage adjuster 86 such that the voltage of the pulse or signal generated by pulse/signal generator 80 is adjusted. For example but not limited to, actuator 140 could be implemented as a digital numeric entry system, a keypad device, or a appropriately configured switching device. Similarly, the testing personnel during testing of transformer 24 may elect to adjust the width of the pulse or signal generated by pulse/signal generator 80. Actuator 142 is coupled to the pulse/signal width adjuster 88 so that the pulse or signal width may be adjusted. Like actuator 140, in one embodiment actuator 142 is a control dial. However, actuator 142 may be implemented using the alternative devices like those described above for actuator 140.

C. Exemplary Pulse or Test Signal

Figure 3:
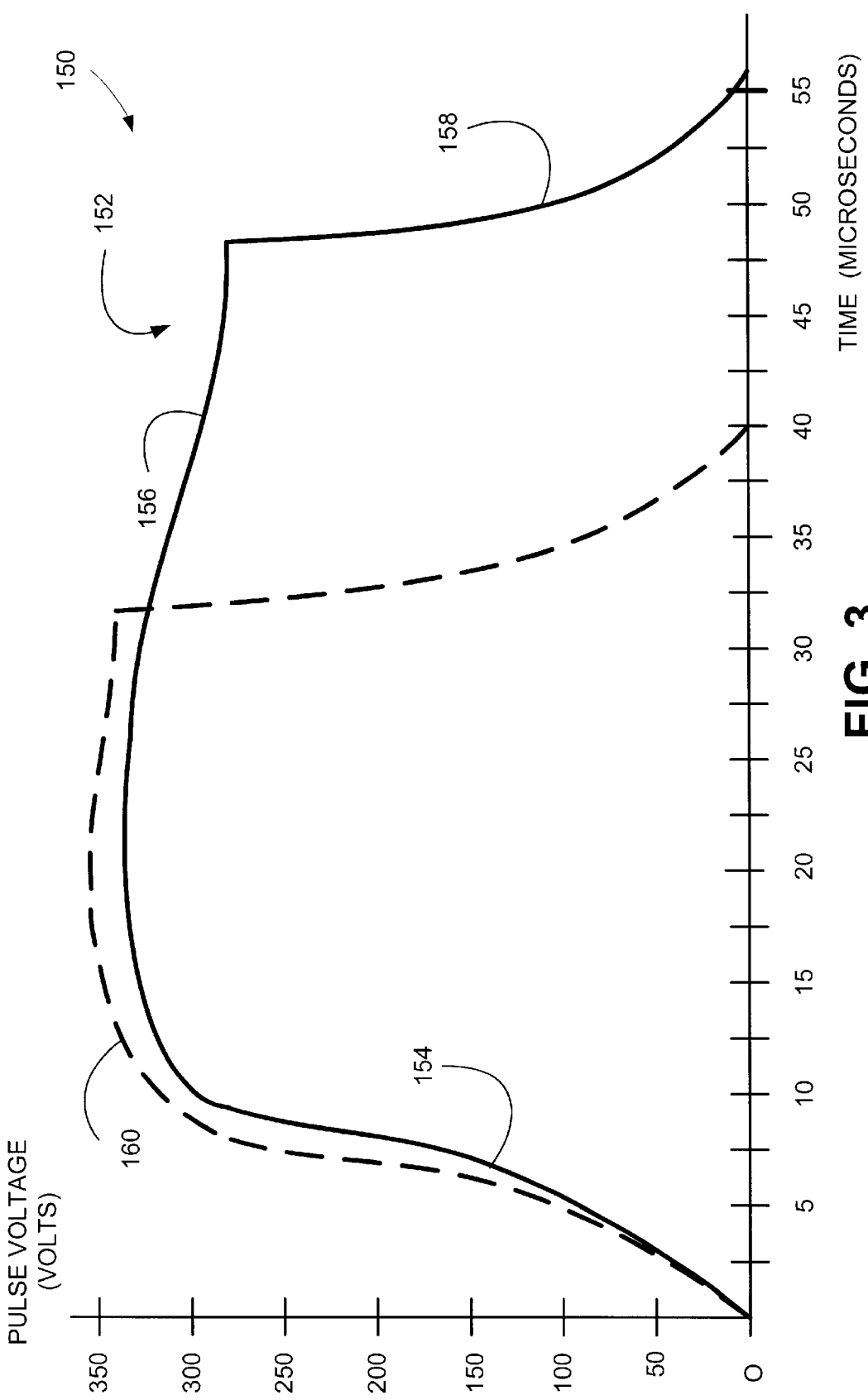
FIG. 3 is a graph showing two exemplary test pulses applied by the winding test unit to the transformer of FIGS. 1 and 2.

FIG. 3 is a graph 150 showing two exemplary test pulses applied by the winding test unit 20 (FIGS. 1 and 2) to a winding (not shown) residing in transformer 24. Such pulses are known as double exponential waveforms chopped on the tail. The first exemplary pulse 152 is illustrated by a solid line. Pulse 152 has a rise time illustrated by segment 154. Pulse 152 has a pulse width approximately equal to 45 microseconds, as illustrated by segment 156. At approximately 48 microseconds, the tail of pulse 152 is chopped such that the pulse quickly decays to 0 volts, as illustrated by segment 158. Pulse 152 is seen to have a peak pulse magnitude of approximately 325 volts.

The second pulse 160 is illustrated in FIG. 3 with a dashed line. Pulse 160 has a pulse width of approximately 35 microseconds and a peak magnitude of approximately 350 volts. Thus, pulse 160 is different from pulse 152 by both peak pulse magnitude and pulse width.

Pulses 152 and 160 illustrate that the winding test unit 20 applies different pulses or signals to the tested transformer 24 (FIGS. 1 and 2). Furthermore, other characteristics of pulses 152 and 160 may be altered by winding test unit 20 to produce pulses that differ from each other. For example, rise times and decay times of the pulses 152 and 160 may differ. Also, variations may be made in the pulse rise time, decay times, the time of the chop, the chop time and/or other various characteristics. One or several or any combination of the pulse parameters described above may be altered from one test pulse to the next. One skilled in the art will appreciate that any variety of suitable pulse or suitable signals may be generated by the winding test unit 20 such that the input pulse or signal has sufficient energy to propagate through the tested windings, and such that the characteristics of the input pulse or signal are sufficient to provide a suitable output pulse or signal detectable at terminal 50 (FIGS. 1 and 2). Thus, the testing personnel performing the transformer test using winding test unit 20 determines the appropriate voltage and pulse width of the input pulse or signal applied to the transformer windings such that a suitable output pulse or signal is detected. An alternative embodiment of the winding test unit 20 is configured to automatically adjust the characteristics of the input pulse or signal, either randomly or by a predefined algorithm.

Also, the form of the input pulse or signal may be varied in a variety of manners so long as a suitable output pulse or signal is detected. For example, a triangular shaped signal, a stair-stepped shaped signal, a spiked signal, a square wave, a sinusoidal signal or a combination signal having portions of various signal types are used in alternative embodiments of the winding test unit 20 (FIGS. 1 and 2). Furthermore, one skilled in the art will appreciate that the voltage and width of the exemplary pulses 152 and 160 illustrate exemplary test pulses employed by one embodiment of the winding test unit 20. Thus, a suitable input pulse or signal generated by pulse/signal generator 80 may have forms, voltages and widths that are different from the exemplary pulses 152 and 160 so long as such alternative input pulses or signals propagate through the windings of transformer 24 so that a suitable output pulse or signal can be detected by sensing element 22 (FIGS. 1 and 2).

D. Testing Procedure

A hypothetical illustrative test procedure is now described whereby a winding (not shown) residing in transformer 24 (FIGS. 1 and 2) is tested using winding test unit 20 (FIGS. 1 and 2). First, the transformer 24 must be fully de-energized. When testing a transformer in the field, the transformer is physically isolated from the energy distribution system. An energized transformer 24 operating as part of an energy delivery system may be isolated by any of the conventional means employed in the arts, such as, but not limited to, by opening circuit breakers (not shown) or by opening disconnect switches (not shown). Prior to coupling the winding test unit 20 and the sensing element 22 to transformer 24, it is advisable to conduct additional testing of transformer 24 to ensure that the transformer 24 is in fact physically isolated from the energy delivery system and fully de-energized. Grounding of the transformer windings may be appropriate to ensure that any residual charges residing in the transformer have been fully discharged. Such well known additional testing is desirable to ensure the safety and health of the testing personnel and to protect the winding test unit 20 and sensing element 22 from possible damage.

Then, the testing personnel couples connections 60 and 64 to a selected terminal on the transformer 24 (such as terminal 34 as illustrated in FIGS. 1 and 2). Coupling may be facilitated with the releasable fastener 110. The testing personnel also couples connections 62 and 66 to the bushing flange 52 of the high voltage bushing 28 that is coupled to the winding to be tested. Then, the testing personnel couples connection 68 to terminal 50 of the neutral bushing 48 (facilitated by the releasable fastener 97) and couples connection 70 to bushing flange 52 with connector 118. Next, the testing personnel would couple sensing element 22 to the winding test unit 20 with connection 26.

One skilled in the art will appreciate that the above-described procedure for coupling winding test unit 20 and sensing element 22 to the appropriate points on transformer 24 describes only one possible sequence of coupling winding test unit 20 and sensing element 22 to transformer 24. Winding test unit 20 and sensing element 22 may be coupled to the appropriate points on transformer 24 in a different sequence, so long as all of the connections between winding test unit 20, sensing element 22, and transformer 24 are completed before the application of an input pulse or signal to the winding to be tested.

After the winding test unit 20 and sensing element 22 are coupled to transformer 24, as described above, the testing personnel applies a pulse or signal generated by the winding test unit 20 to the terminal 34 of transformer 24 by actuating actuator 128. The input pulse or signal is detected on connection 58 at terminal 34 and the output pulse or signal is detected by the sensing element 22 at terminal 50. In an embodiment of the winding test unit 20 having a viewing screen 96, the testing personnel may view the detected output pulse or signal on viewing screen 96 to determine if an adequate output pulse or signal has been detected. Also, the testing personnel may elect to view the applied input pulse or signal to determine if the applied input test or signal was suitable. Furthermore, the testing personnel may have processor 84 analyze the detected input and output signal and display one of the selected outputs, described below, on viewing screen 96 to further verify that the detected input and output signals are adequate. If the detected output signal is not sufficiently adequate to provide a valid and accurate test, the testing personnel may adjust the pulse or signal voltage through actuator 140 that actuates the pulse/signal voltage adjuster 86 to alter the voltage of the pulse or signal provided by the pulse/signal generator 80. Similarly, the testing personnel may adjust actuator 142 so that the pulse/signal width adjuster 88 adjusts the width of the input pulse or signal generated by the pulse/signal generator 80. In alternative embodiments providing for a variety of pulse shapes and configurations, the testing personnel may select a different pulse type. Another pulse or signal would then be applied to terminal 34 and the output pulse or signal would be analyzed as described above to ensure that an adequate output pulse or signal is detected such that a valid and accurate test can be conducted on the transformer 24. The above-described process of applying an input pulse or signal to transformer 24, and then analyzing the suitably of the detected output signal, is repeated in an iterative process until the testing personnel is satisfied that a suitable output pulse or signal is detected.

Once the testing personnel is satisfied that a suitable output pulse or signal is detected, acquisition of the test data can begin. A first pulse or signal is applied to terminal 34. The first input and output pulse or signal is detected at terminal 34 and terminal 50, respectively, as described above. Signal recorder 82 stores data corresponding to the applied first input pulse or signal, and data corresponding to the detected first output pulse or signal, into the test data storage area 92 of memory 90 such that a first test data pair is acquired. If the testing personnel so desires, the first input pulse or signal and the detected first output pulse or signal may be viewed on viewing screen 96 to ensure that a valid pulse or signal has been generated and a valid first output pulse or signal has been detected for the first test.

Next, the testing personnel induces at least a slight variation in at least one characteristic of the input pulse or signal, such as, but not limited to, the width of the input pulse or signal. Furthermore, the testing personnel may optionally adjust other characteristics of the input pulse or signal, such as, but not limited to, the voltage of the input pulse or signal. The testing personnel then initiates a pulse or signal by actuating actuator 128, thereby causing pulse/signal generator 80 to generate a second input pulse or signal. A second output pulse or signal is then detected. Signal recorder 82 stores data corresponding to the second input pulse or signal and data corresponding to the second detected output pulse or signal in the test data storage area 92 of memory 90 such that a second test data pair is acquired. The testing personnel may then optionally decide to view the second input pulse or signal and/or the second detected output pulse or signal.

The above-described testing process is then repeated for a plurality of additional input pulse or signals as described above. Data corresponding to the generated input pulse or signal, and data corresponding to the detected output pulse or signal, is stored in the test data storage area 92 for each of the applied input pulses or signals in a manner described above. The testing personnel may apply any suitable number of input pulses or signals during this testing process. The number of applied input pulses or signals is determined upon the specific test being conducted. It is desirable to adjust at least one characteristic of the input pulse or signal (such as the pulse width) between each succeeding generated input pulse or signal. The number of input pulses or signals must be sufficiently large so that a suitable data base of test data pairs is created such that the analysis of the test data will provide a valid and reliable characteristic signature for the tested transformer winding.

Upon the conclusion of the above-described testing process, the testing personnel may elect to activate processor 84 such that the family of test data pairs (generated input and detected output pulses or signals) are analyzed, in a manner described in detail below, to ensure that a valid and reliable test has been completed for the winding coupling between terminal 34 of the high voltage bushing 28 and terminal 50 of the neutral bushing 48. In the event that the test results are not suitably valid or suitably reliable, the testing personnel may elect to re-run the test and reacquire a new family of detected input and output pulses or signals.

Upon the conclusion of the above-described testing process for the winding (not shown) coupled between terminal 34 of the high voltage bushing 28 and terminal 50 of the neutral bushing 48, the above-described testing process could be optionally conducted on the winding coupling between terminal 36 of the high voltage bushing 30 and terminal 50 of the neutral bushing 48. Then, the winding coupled between terminal 38 of the high voltage bushing 32 and terminal 50 of the neutral bushing 48 could be similarly tested. Furthermore, windings coupled between the high voltage bushing and the low voltage bushing for each phase of the transformer may be optionally tested. One skilled in the art will appreciate that there are many winding or winding coupling configurations in a transformer that may be tested by the winding test unit 20 in accordance with the testing procedure described above.

Upon conclusion of the testing of the winding residing in transformer 24 for the selected high voltage bushings 28, 30 and 32, the testing personnel may elect to conduct a complete and thorough on-site analysis of the recorded detected output pulses or signals. Furthermore, the testing personnel may instruct processor 84 to conduct a comparison of the collected test data with test data acquired at a previous time for the same winding (or winding configuration). Thus, the testing personnel may analyze the characteristic signatures of tested winding in transformer 24 determined for the current test with the characteristic signature from previous tests, and thereby determine the likelihood of displacements in the windings (not shown) of transformer 24. In one embodiment, analysis logic 94 executed by processor 84 automatically analyzes the characteristic signatures of the tested winding between the current test and a designated previous test, and then indicates to the testing personnel the results of the analysis using an easy to understand format, as described below.

One skilled in the art will appreciate that due to the inherent coupling of the transformer windings, the above-described test procedure for the winding (not shown) coupled between terminal 34 of the high voltage bushing 28 and terminal 50 of the neutral bushing 48 will additionally detect winding deformation and/or displacement in the portion of the windings that couple (physically and/or magnetically) to the associated low voltage terminal. For example, assume that terminal 34 on high voltage bushing 28 and terminal 46 on low voltage bushing 40 are associated with phase A. If there is deformation and/or displacement on any portions of the windings which couple to terminal 46 of low voltage bushing 40, the test described above for the winding coupled between terminal 34 and terminal 50 will indicate the presence of any such deformation and/or displacement. Similarly, the test conducted by applying an input pulse or signal to terminals 36 and 38 may indicate deformation and/ or displacement in other portions of the transformer windings (not shown) coupled to the respective terminals of low voltage bushings 42 and 44, respectively.

The testing personnel may optionally elect to conduct additional testing of transformer 24. One skilled in the art will appreciate that the input pulse or signal could be similarly applied to any of the terminals 46, and/or terminal 50. Similarly, the sensing element 22 could be coupled to any one of the other available terminals of transformer 24. Such tests would be conducted in a manner described above and analyzed using the process described below. Furthermore, the above testing process was described for the testing of each of the terminals 34, 36 and 38 on the high voltage bushings 28, 30 and 32, respectively. Alternatively, the testing personnel may opt to test only one or only two of the terminals 34, 36 or 38. One skilled in the art will appreciate that the selection of the terminals to be tested will depend upon the specific objectives of the testing process and the desired characteristic signatures that are to be determined.

E. Spectral Analysis of Applied Input and Detected Output Pulses or Signals

As described above, an input pulse or signal is generated by winding test unit 20 (FIGS. 1 and 2) and applied to one of the terminals 34, 36 or 38 of transformer 24. An output pulse or signal is detected by sensing element 22 at the terminal 50. Data corresponding to the detected input and output pulses are then simultaneously digitized and processed by FFT to be allocated to a plurality of predefined frequency bins. Thus, for each of the detected input pulses and output pulses, a frequency domain data point is stored in each one of the frequency bins. Next, the analysis process computes the auto-spectral densities and a cross-spectral density of each of the data points for each frequency bin, as described below.

For each frequency bin, the auto-spectra Gxx(f) is calculated by computing the complex conjugate (*) of the Fast Fourier Transform (FFT) of the input pulse or signal, X(f)*, and then multiplying by the FFT of the same input pulse or signal, X(f), as shown in equation 1 below:

$$G_{xx}(f)=[X(f)^*]X(f) \qquad \text{Eq. 1}$$

Where X(f) is the FFT of the input signal x(t)

Then, for each frequency bin, the auto-spectra Gyy(f) is calculated by computing the complex conjugate (*) of the FFT of the output pulse or signal, Y(f)*, and then multiplying by the FFT of the same output pulse or signal, Y(f), as shown in equation 2 below:

$$G_{yy}(f)=[Y(f)^*]Y(f) \qquad \text{Eq. 2}$$

Where Y(f) is the FFT of the output signal y(t)

The cross-spectra Gxy(f) from input to output is calculated by computing the complex conjugate (*) of the FFT of the input pulse of signal, X(f)*, and multiplying by the FFT of the output pulse or signal, Y(f), as shown in equation 3 below:

$$G_{xy}(f)=[X(f)^*]Y(f) \qquad \text{Eq. 3}$$

Where X(f) is the FFT of the input signal x(t)
And Y(f) is the FFT of the output signal y(t)

A new characteristic signature of the tested transformer winding, H(f), in accordance with the system and method of the present invention, is calculated by averaging a suitable number of the cross-spectra Gxy(f) for each one of the input/output pulse or signal data pairs, and dividing by the corresponding averages of the auto-spectra for each one of the input pulse or signals, $G_{xx}(f)$, in accordance with equation 4 below:

$$H(f) = G_{xy}(f)/G_{xx}(f) \qquad \text{Eq. 4}$$

The characteristic signature of the transformer winding computed according to equation 4 above is then compared to a previously determined characteristic signature of the same transformer winding. One convenient method of comparing is to plot the two characteristic signatures over a frequency range of interest on a single graph. Any significant differences between the two compared characteristic signatures, easily visible when plotted on the same graph, indicates possible deformation of the windings in the tested transformer. The testing personnel or individual analyzing the characteristic signatures, using experience and good engineering judgment, determines the probability of any winding deformation and/or displacement.

For example, if the compared characteristic signatures, each known to be suitably valid and accurate using the coherence function and the random error function described below, track each other relatively closely, the testing personnel or individual analyzing the characteristic signatures could reasonably conclude that the probability of winding deformation and/or displacement was very low, and/or that any actual winding deformations present in the transformer were minimal and within acceptable tolerances expected to occur during normal transformer operating conditions. On the other hand, a wide variation between the characteristic signatures, at all or some frequencies, indicates a higher probability of transformer winding deformation and/or displacement.

Furthermore, the magnitude of the variation may be correlated with probability of winding deformation and the magnitude/severity of winding deformation. In one embodiment, the testing personnel or individual analyzing the characteristic signatures would exercise experience and good engineering judgment to estimate the probability of and/or the extent of the winding deformation and/or displacement.

In another embodiment, the magnitude of the separation of the characteristic signatures could be measured or sampled over the plotted frequency range, and numerically analyzed to calculate an indicator of the probability of and/or the extent of the winding deformation and/or displacement. For example, the separation of the characteristic signatures could be integrated over a selected frequency range and the resultant number could be associated with a probability of and/or an extent of winding deformation and/or displacement.

In another embodiment, the number resulting from the integration of the separation magnitude over the selected frequency range could be compared with a predefined group of ranges, each range being associated with a probability of winding deformation and/or displacement. For convenience, each of the ranges may be associated with a color for ease of reporting results to the testing personnel or individual analyzing the characteristic signatures. For example, the range associated with a low probability of winding deformation and/or displacement may print the numerical result, and/or a related message, in green (traditionally associated with an acceptable condition). The range associated with a high probability of winding deformation and/or displacement may print the numerical result, and/or a related message, in red (traditionally associated with a danger or warning condition). A range associated with an intermediate probability of winding deformation and/or displacement may print the numerical result, and/or a related message, in yellow or orange (traditionally associated with a caution condition). One skilled in the art will appreciate that the above-described three-color indication system may be modified according to the specific needs of the testing personnel in that any suitable number of ranges could be selected and any suitable color could be associated with each of the selected ranges without departing substantially from the operation and functionality of the present invention. Any such alternative embodiment of a winding test unit in accordance with the present invention is intended to be within the scope of this disclosure and to be protected by the accompanying claims.

Once the testing personnel or individual analyzing the characteristic signatures has assessed the probability of winding deformation and/or the extent of winding displacement, a recommended course of action may be determined. For example, an indication of a low probability of winding deformation and/or displacement might indicate a the transformer was operating satisfactorily and had not been subjected to severe electrical or severe mechanical stresses that are likely to cause a transformer fault. An indication of a high probability of winding deformation and/or displacement might indicate a need to immediately remove the transformer from service and to repair the tested transformer. An indication of an intermediate probability of winding deformation and/or displacement might indicate a need for additional testing, more frequent monitoring and testing, or a visual inspection of the windings.

The above-described analysis process is further enhanced by incorporating a coherence analysis of the test data. A coherence function $\gamma^2_{xy}(f)$ is calculated, as shown in equation 5 below:

$$\gamma_{xy}(f) = |G_{xy}(f)|^2/G_{xx}(f)G_{yy}(f) \qquad \text{Eq. 5}$$

The coherence function $\gamma^2_{xy}(f)$ is a real valued function having a magnitude ranging from 0 to 1 for each frequency bin of H(f). A value of 1 would indicate a perfect linear relationship from the input pulse portion to the detected output pulse portion for the various frequency bins in the frequency domain. A value of 0 would indicate a complete non-linear relationship between the input and detected output pulse portions in the frequency bins. A value of 0 would also indicate insufficient energy for the frequencies of interest in the input pulse to transfer to the output pulse. The coherence function $\gamma^2_{xy}(f)$ is very sensitive to relatively small errors in the magnitude (or phase) estimate for the characteristic signature, H(f). Thus, data for a particular winding test should not be considered invalid when the coherence function $\gamma^2_{xy}(f)$ is not equal to 1, but should be weighted accordingly by objective analysis in the test set logic and using good engineering judgment by the testing personnel or other individuals analyzing test results. That is, the coherence function $\gamma^2_{xy}(f)$ indicates the reliability of the test data over the computed frequency range.

Generally, the testing personnel or individual analyzing the test results would review a plot of the coherence function $\gamma^2_{xy}(f)$ over some relevant frequency range. As a rule of thumb, test data may be considered valid for the frequencies having a coherence value of between 1.0 and 0.8. However, test data may be considered as providing useful information for the frequencies having a coherence value of between 0.8 and 0.4. Test data having a coherence value of between 0.4 and 0.0 may be considered as an indication that the computed characteristic signature for those frequencies may be unreliable, and that further testing of the transformer windings to obtain more reliable test data is desirable or that the data for those frequencies should be given little weight in determining the likelihood of winding deformations. Thus, the above rules of thumb will be appreciated by one skilled in the art as merely generalizations for initially interpreting a plot of the coherence function $\gamma^2_{xy}(f)$ over a frequency range of interest. That is, the testing personnel or the individual analyzing the test data may use the coherence function $\gamma^2_{xy}(f)$ as an analysis tool in evaluating the validity and reliability of the test data when determining the likelihood of winding deformation and/or displacement.

The above-described analysis process is further enhanced by incorporating a random error analysis of the test data. The error function indicates the validity of the test data with respect to the applied input pulse or signal and the detected output pulse or signal. For example, if a secure contact is not provided by the connectors, the error function will indicate such. Thus, the error function will not increase significantly for a change due to transformer winding deformation and/or displacement.

A random error function $E_r|H(f)|$ is calculated, as shown in equation 6 below:

$$E_r|H(f)|=[1-\gamma^2_{xy}(f)]^{1/2}/|\gamma_{xy}(f)|(2n_d)^{1/2} \qquad \text{Eq. 6}$$

The term $n_d$ equals the number of spectral densities averaged in the H(f) equation.

The random error, $E_r|H(f)|$, provides a statistical analysis of the test data random error in each frequency bin based on a 95% confidence interval equation. The testing personnel or the individual analyzing the test data may conveniently analyze and interpret the calculated random errors by plotting the random error over a frequency range of interest. Such a graph will result in two lines being plotted over the frequency range of interest, with the spacing between the two lines indicating the 95% confidence interval for the test data. When the two plotted lines indicating the 95% confidence interval are relatively close together, the testing personnel or the individual analyzing the test data may conclude that the test data is reliable. When the two plotted lines indicating the 95% confidence interval are relatively far apart, the testing personnel or the individual analyzing the test data may conclude that the test data is not reliable, and that further testing of the transformer windings to obtain more reliable test data is desirable or that the data for those frequencies should be given little weight in determining the likelihood of winding deformations. Thus, the plot of the 95% confidence interval will be appreciated by one skilled in the art as an indication of the validity and reliability of the characteristic signature, H(f), over a frequency range of interest. That is, the testing personnel or the individual analyzing the test data may use the 95% confidence interval as an analysis tool in evaluating the validity and reliability of the test data when determining the likelihood of winding deformation and/or displacement.

During data acquisition by one embodiment of the winding test unit 20 (FIGS. 1 and 2), voltage and/or current of the input pulse or signal, and voltage and/or current of the detected output pulse or signal, is detected and stored in memory 90 (FIG. 2). The data analysis process described above may be further enhanced by incorporating an analysis of the phase transfer function and the admittance transfer function of the test data. When comparing the phase transfer function and/or the admittance transfer function of the current test against the phase transfer function and/or the admittance transfer function of a previous test, relatively large variations between the phase transfer function and/or the admittance transfer function may indicate the presence of winding deformation and/or displacement, particularly if such relatively large variations between the phase transfer function and/or the admittance transfer function occur at the same or similar frequencies where the comparison of the characteristic signature indicates a significant change. One skilled in the art will appreciate that the consideration of such related tests, and other well known transformer testing techniques, when used in conjunction with the new characteristic signature of the transformer winding determined in accordance with the present invention, will enable the testing personnel or the individual analyzing test results to more reliably predict the presence of and/or the severity of winding deformation and/or displacement, and the associated likelihood of transformer fault occurring in the future.

F. Exemplary Transformer Test Results

FIGS. 4 through 7 are graphs of actual test results for a 230/26 kV transformer. FIG. 8 is a comparison of two characteristic signatures for the tested winding of the 230/26 kV transformer. The 230/26 kV transformer is rated at 56 mega-volt amps (MVA, 65° C./forced air). The 230/26 kV transformer was manufactured by the North American Transformer Company, a division of Reliance Electric, having serial number 51205-1.

The 230/26 kV transformer was initially tested on Nov. 14, 2000 at its installed location in the substation. In accordance with the testing procedure described above, the 230/26 kV transformer was de-energized and de-coupled from the energy delivery system prior to testing. Subsequent to the initial testing, the 230/26 kV transformer was relocated to a transformer repair facility. The transformer windings were found at less than specified tightness so they were reclamped by tightening the claming screws to each winding. A second testing of the 230/26 kV transformer was conducted on Feb. 5, 2001 after the winding reclamping at the transformer repair facility.

Figure 4:
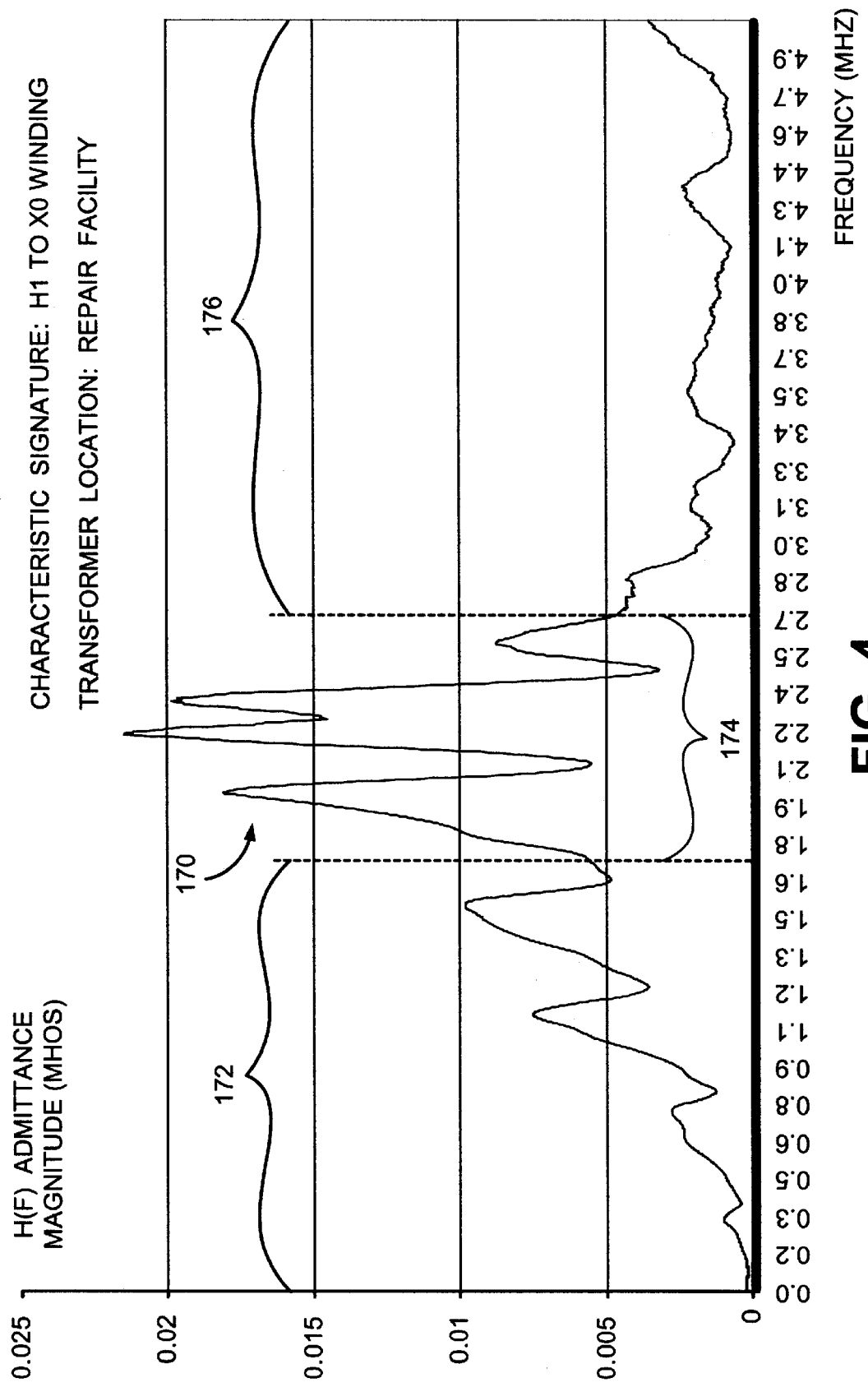
FIG. 4 is a graph of the transfer function H(f) for the H1 to X0 winding for the transformer after repair.

FIG. 4 is a graph of the transfer function H(f) 170 for the H1 to X0 winding over a frequency range of approximately 3.0 kilohertz (kHz) to approximately 5.0 megahertz (MHz) for the 230/26 kV transformer after reclamping was completed. The graphed transfer function H(f) for the tested H1 to X0 winding is hereinafter referred to as the transformer winding characteristic signature after reclamping 170. For convenience of discussing a comparison of the transformer testing results, the transformer winding characteristic signature after reclamping 170 is subdivided into three sections 172, 174 and 176. Section 172 corresponds to the transformer winding characteristic signature over the frequency range of approximately 3.0 kHz to approximately 1.7 MHz. The second section 154 corresponds to the transformer winding characteristic signature from approximately 1.7 MHz to approximately 2.7 MHz. The third section 176 corresponds to the transformer winding characteristic signature from approximately 2.7 MHz to approximately 5.0 MHz.

For convenience of plotting the transformer winding characteristic signature after reclamping 170, a frequency range of approximately 3.0 kHz to approximately 5.0 MHz was selected by the testing personnel. One skilled in the art will appreciate that the testing personnel could have selected any suitable frequency testing range for plotting. Also, for convenience of plotting the transformer winding characteristic signature after reclamping 170, the selected vertical axis is the admittance magnitude of the transfer function H(f) as calculated in accordance with equation 4 above. One skilled in the art will appreciate that the vertical axis units could be plotted in a suitable alternative value. One embodiment of the winding test unit 20 (FIGS. 1 and 2) will have fixed the plot axis to a pre-defined range and value. Alternative embodiments of the winding test unit 20 are configured to allow the testing personnel to selectively alter the plotted frequency range and/or to selectively alter the vertical axis plotting value and/or plot scale. Any such alternative embodiments providing for a variety of alternative graph formats for the transformer winding characteristic signature, and for the other graphs described below, may be implemented without departing substantially from the operation and functionality of the present invention, and are intended to be within the scope of this disclosure and to be protected by the accompanying claims.

Figure 5:
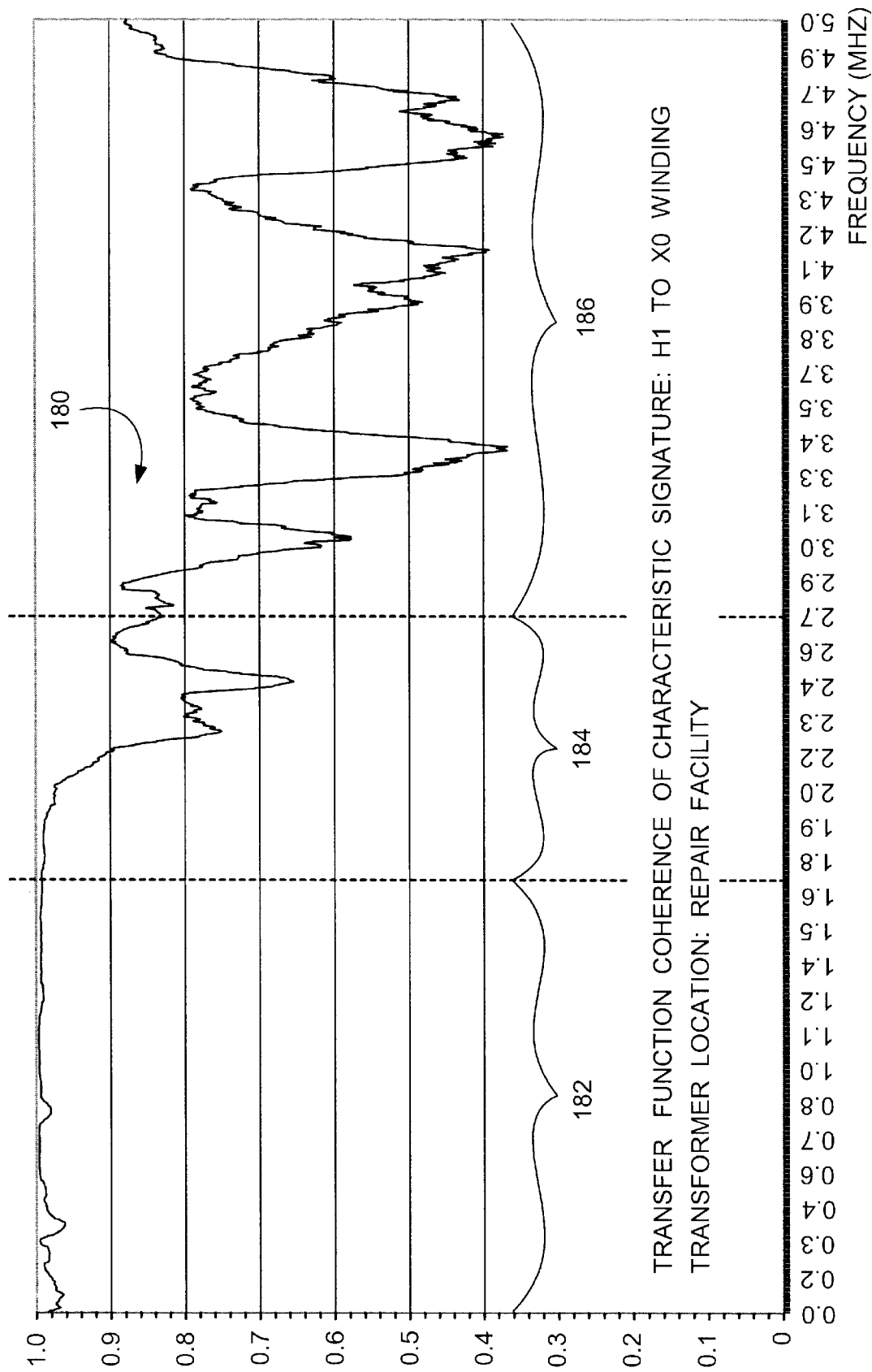
FIG. 5 is a graph of the transfer function coherence associated with the transformer winding characteristic signature after repair of FIG. 4.

FIG. 5 is a graph of the transfer function coherence 180 associated with the transformer winding characteristic signature after reclamping 170 (FIG. 4). For convenience of discussing the transfer function coherence, the transformer function coherence graph 180 is subdivided into three sections, 182, 184 and 186. Section 182 corresponds to the transfer function coherence over the frequency range of approximately 3.0 kHz to approximately 1.7 MHz. The second section 184 corresponds to the transfer function coherence from approximately 1.7 MHz to approximately 2.7 MHz. The third section 186 corresponds to the transfer function coherence from approximately 2.7 MHz to approximately 5.0 MHz.

Section 182 illustrates that the transfer function coherence is nearly equal to 1.0. Thus, the testing personnel or the individual analyzing the test data could reasonably conclude that the transformer winding characteristic signature after reclamping 170 (FIG. 4) over the frequency range of approximately 3.0 kHz to approximately 1.7 MHz is valid and reliable.

Section 184 illustrates that the transfer function coherence ranges from approximately 1.0 to approximately 0.6. A significant portion of the transfer function coherence in section 184 lies between a range of 1.0 and 0.8. Thus, the testing personnel or an individual analyzing the test result may reasonably conclude that the transformer winding characteristic signature after reclamping 170 (FIG. 4) is reasonably valid and reliable over the frequency range of approximately 1.7 MHz to approximately 2.7 MHz.

The transfer function coherence for section 186 ranges from approximately 0.9 to approximately 0.4. A significant portion of the transformer function coherence ranges between 0.8 and 0.4. The testing personnel or an individual analyzing the test results may reasonably conclude that there is some level of inaccuracy or distortion in the transformer winding characteristic signature after reclamping 170 in the frequency range of approximately 2.7 MHz to approximately 5.0 MHz. However, because the transfer function coherence over section 186 lies between 0.8 and 0.4, the transformer winding characteristic signature after reclamping 170 in the frequency range of approximately 2.7 MHz to approximately 5.0 MHz should not be entirely discounted and/or disregarded. Rather, the transfer function coherence over section 186 indicates that the corresponding portion of the transformer winding characteristic signature after repair does contain some useful information.

The transfer function coherence graph 180 has very few portions having a value between 0.0 and 0.4. Those few portions span very small frequency ranges. Thus, the testing personnel or the individual analyzing the test results may reasonably conclude that the transfer function coherence graph 180 is indicating that the testing of the H1 to X0 winding of the 230/26 kV transformer provided reasonably valid and reliable data.

Figure 6:
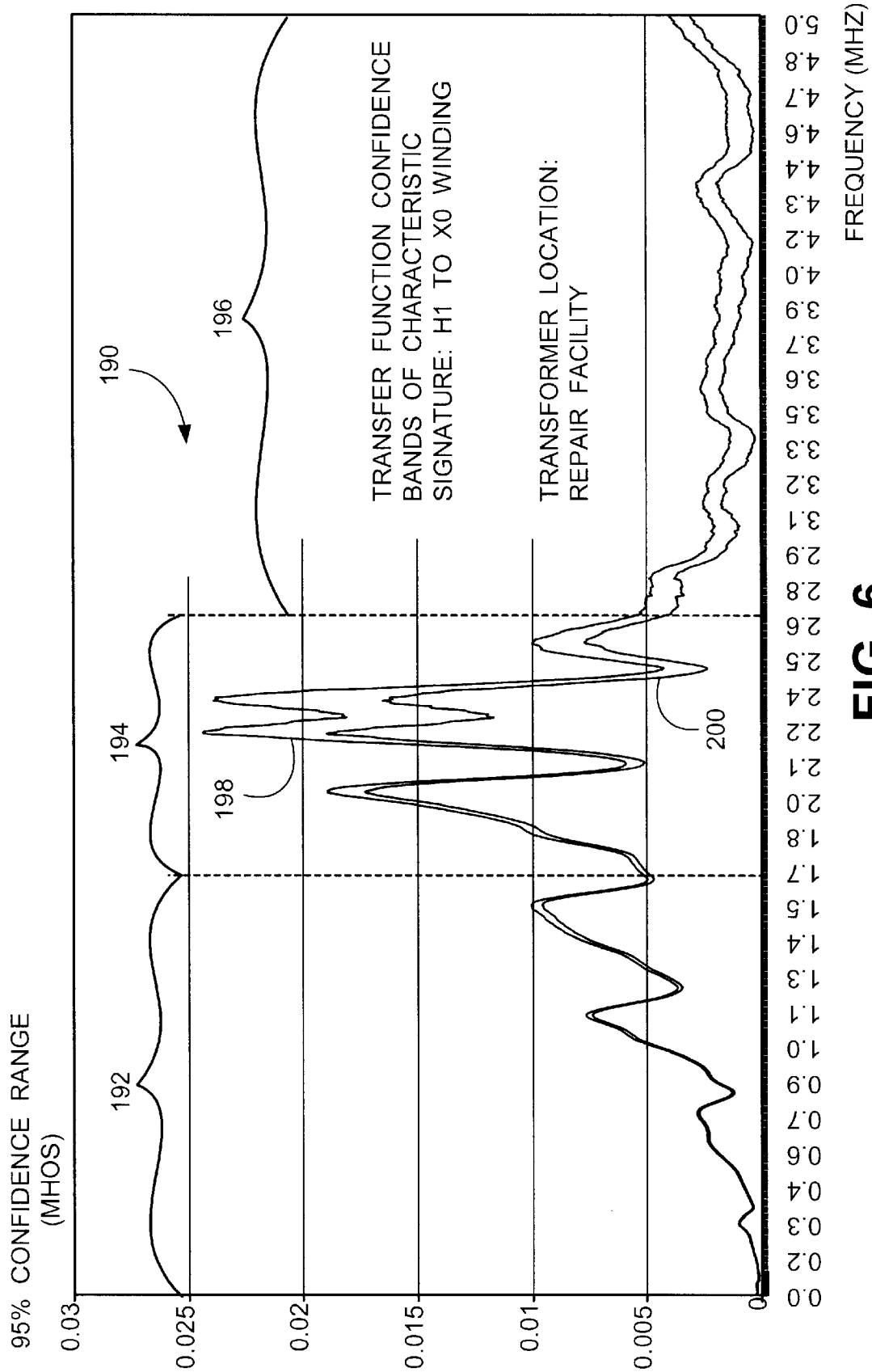
FIG. 6 is a graph of the transfer function confidence bands associated with the transformer winding characteristic signature after repair of FIG. 4.

FIG. 6 is a graph of the transfer function confidence bands 190 associated with the transformer winding characteristic signature after reclamping 170 (FIG. 4). The transfer function confidence bands 190 are graphed over a frequency range of approximately 3.0 kHz to approximately 5.0 MHz. For convenience of discussing a comparison of the transfer function confidence bands 190, the graph is subdivided into three sections 192, 194 and 196. Section 192 corresponds to the transfer function confidence bands graph over the frequency range of approximately 3.0 kHz to approximately 1.7 MHz. The second section 194 corresponds to a frequency range from approximately 1.7 MHz to approximately 2.7 MHz. The third section 196 corresponds to a frequency range from approximately 2.7 MHz to approximately 5.0 MHz.

The transfer function confidence bands 190 are made of an upper band line 198 and a lower band line 200. The relative magnitude of separation between the upper band line 198 and the lower band line 200 at any particular frequency indicates the 95% probability range of the corresponding data point on the graph of the transformer winding characteristic signature after reclamping 170 (FIG. 4). When the upper band line 198 and the lower band line 200 are relatively close together, the testing personnel or an individual analyzing the test results will appreciate that the associated data point on the graph of the transformer winding characteristic signature after reclamping 170 is reasonably valid and reliable. Alternatively, when the upper band line 198 and the lower band line 200 at a particular frequency are separated by a relatively large distance, the testing personnel or the individual analyzing the test results will reasonably conclude that there may be some degree of error in the plotting of the associated data point on the graph of the transformer winding characteristic signature after reclamping 170.

Section 192 indicates that the data points plotted on the graph of the transformer winding characteristic signature after reclamping 170 between a frequency of approximately 3.0 kHz and approximately 1.7 MHz are valid and reliable data points because the upper band line 198 and the lower band line 200 are nearly coincident to each other. That is, the transformer winding characteristic signature after reclamping 170 provides valid and reliable information over the frequency range from approximately 3.0 kHz to approximately 1.7 MHz.

Section 194 indicates that the data points on the graph of the transformer winding characteristic signature after reclamping 170 may have data points exhibiting some degree of questionable validity and reliability. For example, at a frequency of approximately 2.2 MHz, the upper band line 198 is approximately 0.018. The lower band line 200 is approximately 0.012 at the same frequency. This relatively wide separation, having a magnitude of 0.006 (0.018–0.012), indicates that the data points on the graph of the transformer winding characteristic signature after reclamping 170 for the frequency of 2.2 MHz could range anywhere from a value of 0.012 to 0.018 with a 95% probability. Furthermore, the relatively wide range of separation between the upper band line 198 and the lower band line 200 occurs over the frequency range of approximately 2.15 MHz to approximately 2.5 MHz. The testing personnel or the individual analyzing the test results may reasonably conclude that the wide separation between the upper band line 198 and the lower band line 200 is indicative of a range of questionable data that should be viewed with some degree of caution.

Section 196 illustrates that the separation (band width) between the upper band line 198 and the lower band line 200 is approximately 0.001 MHOS. This relatively small band width separation indicates to the testing personnel or an individual analyzing the test results that the data points for the graph of the transformer winding characteristic signature after reclamping 170 over the frequency range of approximately 2.7 MHz to approximately 5.0 MHz is reasonably valid and reliable.

The testing personnel or the individual analyzing the test results, upon consideration of section 182 (FIG. 5) which exhibits a transfer function coherence nearly equal to unity, and upon consideration of section 192 (FIG. 6) which indicates practically no separation between the upper band line 198 and the lower band line 200, may reasonably conclude that the data points associated with the graph of the transfer winding characteristic signature after reclamping 170 (FIG. 4) is valid and reliable.

As noted above, the transfer function coherence graph 180 (FIG. 5) indicated to the testing personnel that the data for the frequency range of approximately 2.7 MHz to approximately 5.0 MHz may have some degree of inaccuracy. However, this degree of inaccuracy may be acceptable given that a substantial portion of section 186 resided in a range of between 1.0 and 0.4. Furthermore, when viewed in consideration of the relative closeness of the upper band line 198 (FIG. 6) and the lower band line 200 shown in section 196 of the transfer function confident bands 190, the testing personnel or an individual analyzing the test results may reasonably conclude that overall, the data points on the graph of the transformer winding characteristic signature after reclamping 170 (FIG. 4) are reasonably valid and reliable, and that any conclusions drawn based upon an analysis of section 176 (FIG. 4) will be reasonably valid.

Similarly, upon consideration of section 184 (FIG. 5) of the transfer function coherence graph 180 and upon consideration of section 194 of the transfer function confidence bands 194, the testing personnel or an individual analyzing the test results may reasonably conclude that the data points on the graph of the transformer winding characteristic signature after reclamping 170 (FIG. 4) is reasonably valid and reliable over the frequency range of approximately 2.7 MHz to approximately 5.0 MHz. That is, even though there is some degree of separation between the upper band line 198 (FIG. 6) and the lower band line 200 over portions of section 194 that indicates the potential for some inaccuracy of the data points, the majority of the transfer function coherence data points in section 184 (which lie between a range of 1.0 and 0.8) tend to offset concerns about the inaccuracy of the data points.

Figure 7:
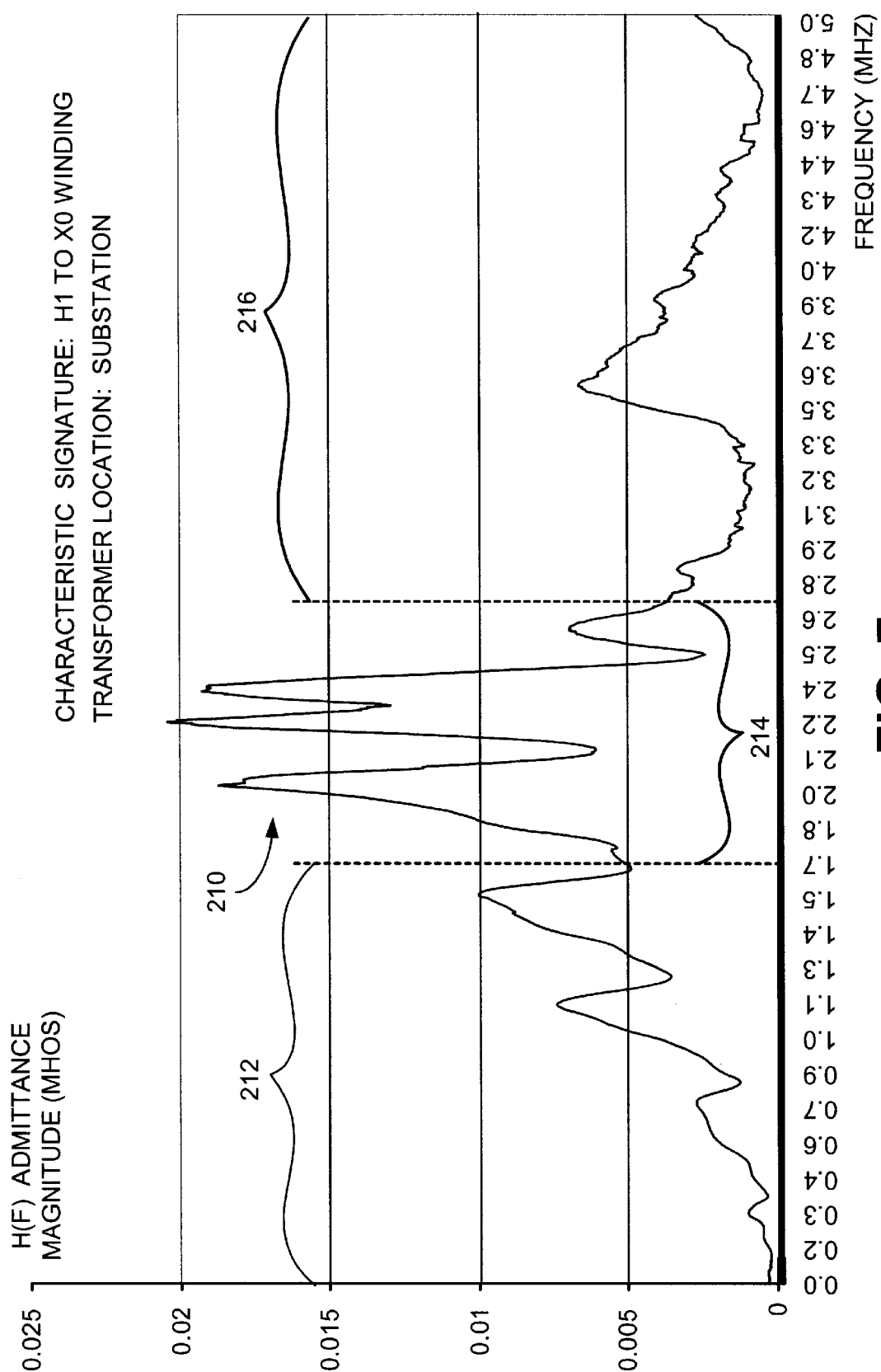
FIG. 7 is a graph of the transfer function H(f) for the H1 to X0 winding of the tested transformer before repair.
Figure 8:
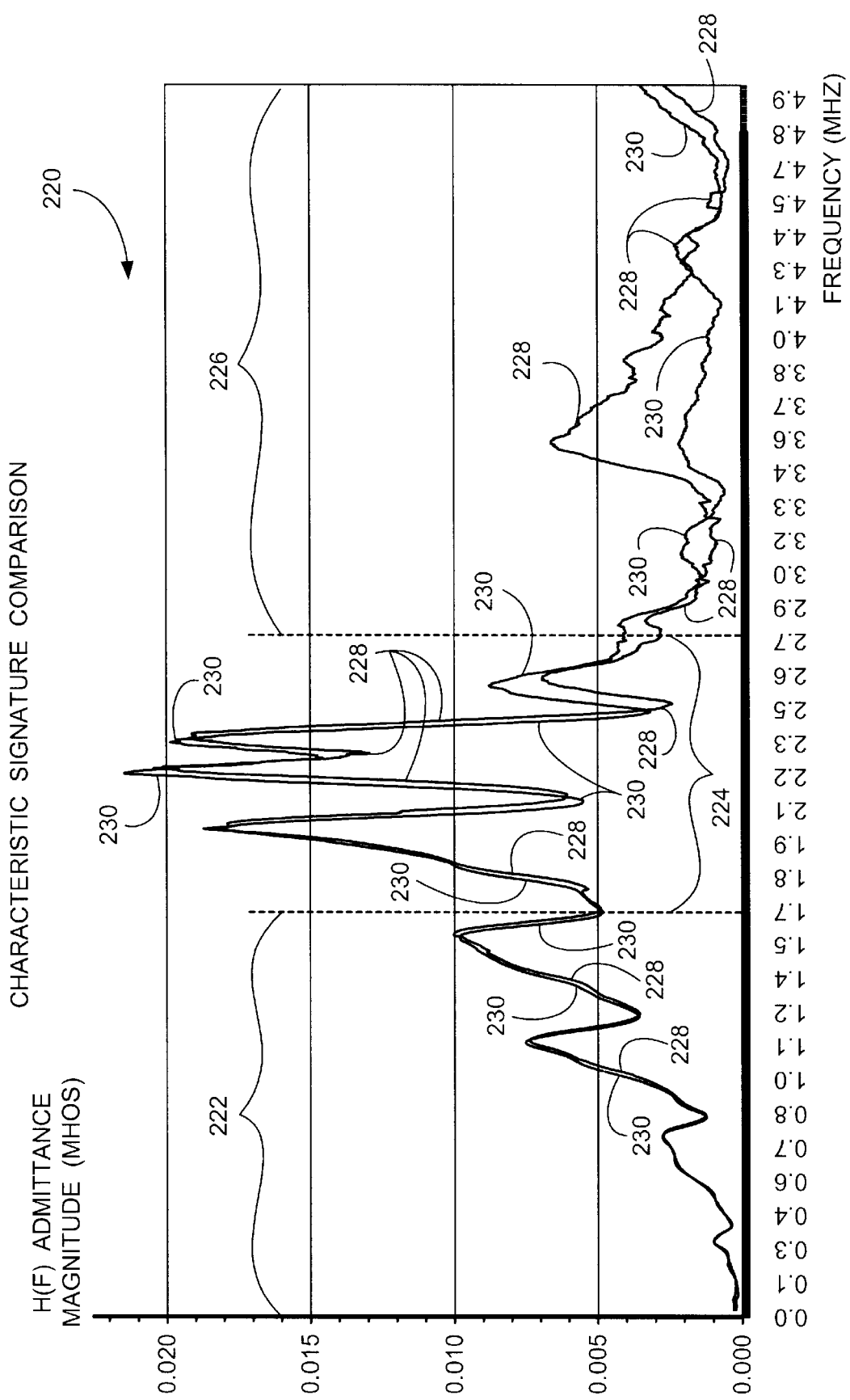
FIG. 8 is a graph of the transformer winding characteristic signature before repair and the graph of the transformer winding characteristic signature after repair.

FIG. 7 is a graph of the transfer function H(f) 210 for the H1 to X0 winding of the tested transformer before reclamping. H(f) 210 is graphed over a frequency range of approximately 3.0 kHz to approximately 5.0 MHz. The graph transfer function for the tested H1 to X0 winding is hereinafter referred to as the transformer winding characteristic signature before reclamping 210. For convenience of discussing a comparison of the transformer testing result, the transformer winding characteristic signature before reclamping 210 is subdivided into three sections 212, 214 and 216. Section 212 corresponds to the transformer winding characteristic signature over the frequency range of approximately 3.0 kHz to approximately 1.7 MHz. The second section 214 corresponds to a frequency of approximately 1.7 MHz to approximately 2.7 MHz. The third section 216 corresponds to a frequency range of approximately 2.7 MHz to approximately 5.0 MHz.

As described above, the 230/26 kV transformer winding H1 to X0 was tested on site at the substation where the transformer was located and before reclamping of the windings at the transformer repair facility. During reclamping, a displacement of approximately ⅛' to ¼" occurred in the positions of the transformer winding clamping plates. This displacement represents a relatively minor adjustment to bring the clamping pressure back to specifications. However, other transformers are often found to have significantly greater displacements requiring significantly greater adjustments to the clamping plates.

FIG. 8 is a graph 220 of the transformer winding characteristic signature before reclamping, plot 228, and the graph of the transformer winding characteristic signature after reclamping, plot 230. The transformer winding characteristic signature before reclamping 228 corresponds substantially with the transformer winding characteristic signature before reclamping 210 of FIG. 7. Similarly, the graph of the transformer winding characteristic signature after reclamping 230 is substantially similar to the graph of the transformer winding characteristic signature after reclamping 170 of FIG. 4. Graph line 228 may differ from graph line 210, and graph line 230 may differ slightly from graph line 170, due to variations in the frequency axis scale and the admittance magnitude axis scale.

By graphing both plots 228 and 230 on a single graph, the testing personnel or an individual analyzing the test results can readily ascertain any significant differences between the two characteristic signatures of the H1 to X0 winding coupling. For convenience of comparing the transformer testing results, the graph is subdivided into three sections 222, 224 and 226. Section 222 corresponds to a frequency range of approximately 3.0 kHz to approximately 1.7 MHz. The section 224 corresponds to a frequency range of approximately 1.7 MHz to approximately 2.7 MHz. Section 226 corresponds to a frequency range of approximately 2.7 MHz to approximately 5.0 MHz.

Upon analysis of the two plots 228 and 230, the testing personnel or person analyzing the test results will readily appreciate that the two characteristic signature plots 228 and 230 closely correspond to each other over sections 222 and 224. However, some difference between the plot 228 and the plot 230 are apparent over section 226. Particularly, over the frequency range of approximately 3.4 MHz to approximately 4.1 MHz, the plots 228 and 230 are significantly separated from each other. This significant amount of separation indicates the probability of some winding deformation and/or displacement between the time of the test used to derive plot 228 and the time of the test used to derive plot 230. In fact, because of the known reclamping made to the 230/26 kV transformer at the repair facility between the two testing times, a small amount of winding displacement is known to have occurred. The known winding displacement is illustrated in FIG. 8 by the divergence of the plot 228 and the plot 230 over the frequency range from approximately 3.4 MHz to approximately 4.1 MHz. Thus, the actual test results demonstrate the validity and reliability of the system and method of the present invention.

G. Testing Method and Process Overview

Figure 9:
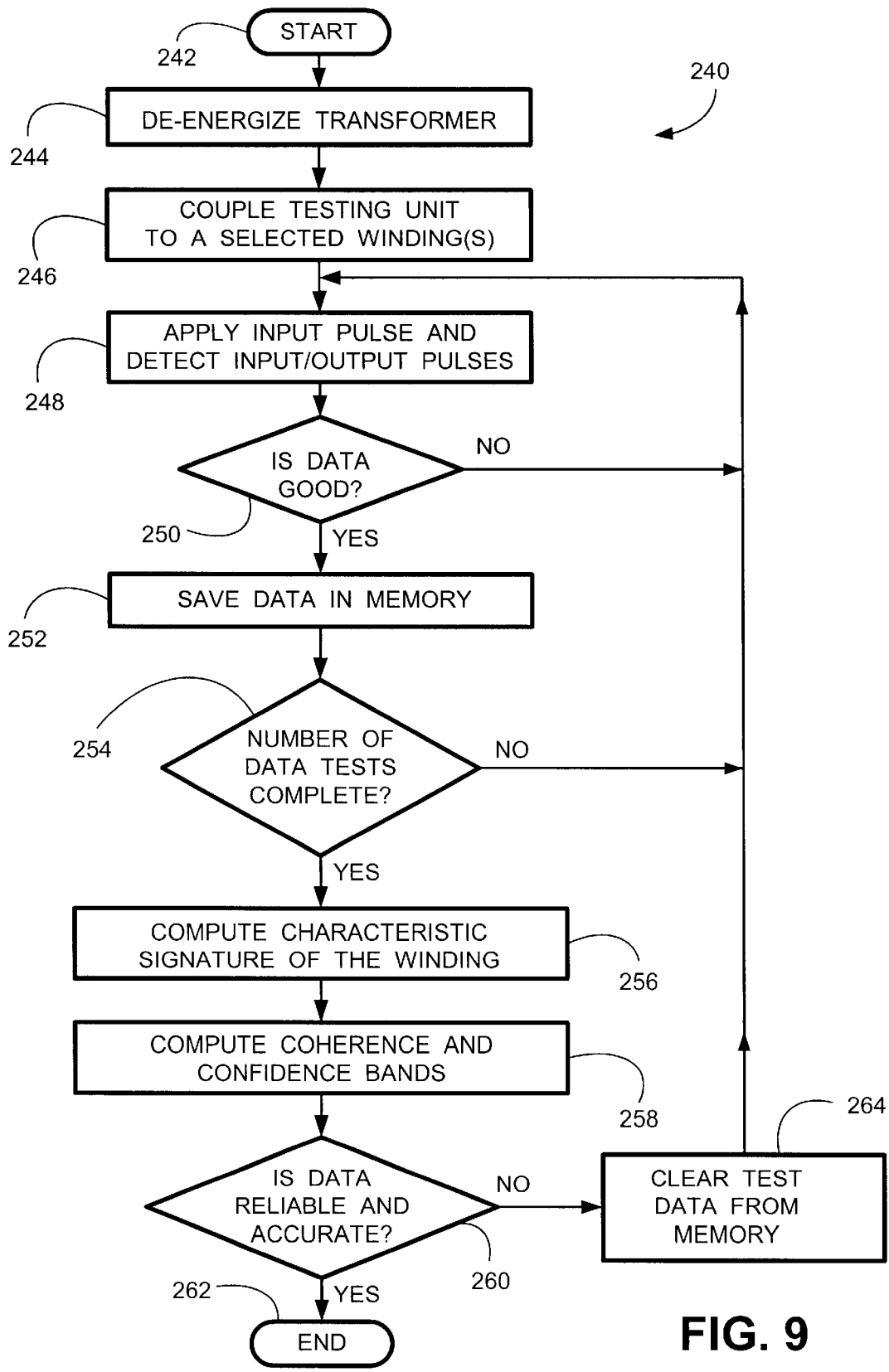
FIG. 9 is a flow chart illustrating an overview of the winding testing process and method.

FIG. 9 is a flow chart 240 illustrating an overview of the winding test process and method. The process starts at block 242. The testing personnel de-energizes the transformer to isolate the winding from the energy delivery system, as indicated at block 244. At block 246, the testing personnel couples the testing unit to a selected winding or between selected windings residing in the transformer. Next, at block 248, the testing personnel prompts the winding test unit 20 (FIGS. 1 and 2) to apply an input pulse or signal to the winding. Test unit 20 then detects the associated input and output pulse or signal. The testing personnel may optionally review the input and output pulse/signal to determine if the data was good, as indicated at block 250. If the data is not good (the NO condition), the process returns to block 248. If the data is good (the YES condition), the data is saved in memory at block 252.

As described above in detail, the entire test process requires a plurality of pulses to be applied to the winding that is being tested. Thus, at block 254, the testing personnel determines if an adequate number of data tests have been completed. If additional tests (application of an input pulse or signal) must be performed (the NO condition), the process returns to block 248. If a suitable number of data tests have been completed (the YES condition) at block 254, the process proceeds to block 256 wherein processor 84 (FIG. 2) executes the analysis logic 94 (FIG. 2) to compute the characteristic signature of the tested winding. At block 258, the processor 84 executes analysis logic 94 to compute at least the coherence and confidence bands for the test data. At block 260, the testing personnel determines, based upon the computed coherence and confidence bands, whether or not the test data is valid and reliable. If the test data is valid and reliable (the YES condition), the testing of the winding is complete and the process ends at block 262. However, if the testing personnel concludes that the test data is not valid and/or reliable (the NO condition), the test data is cleared from memory 90 (FIG. 2) and the process proceeds back to block 248 so that new test data can be accumulated for the winding.

H. Alternative Embodiments of a Transformer Testing System And Method

Figure 10:
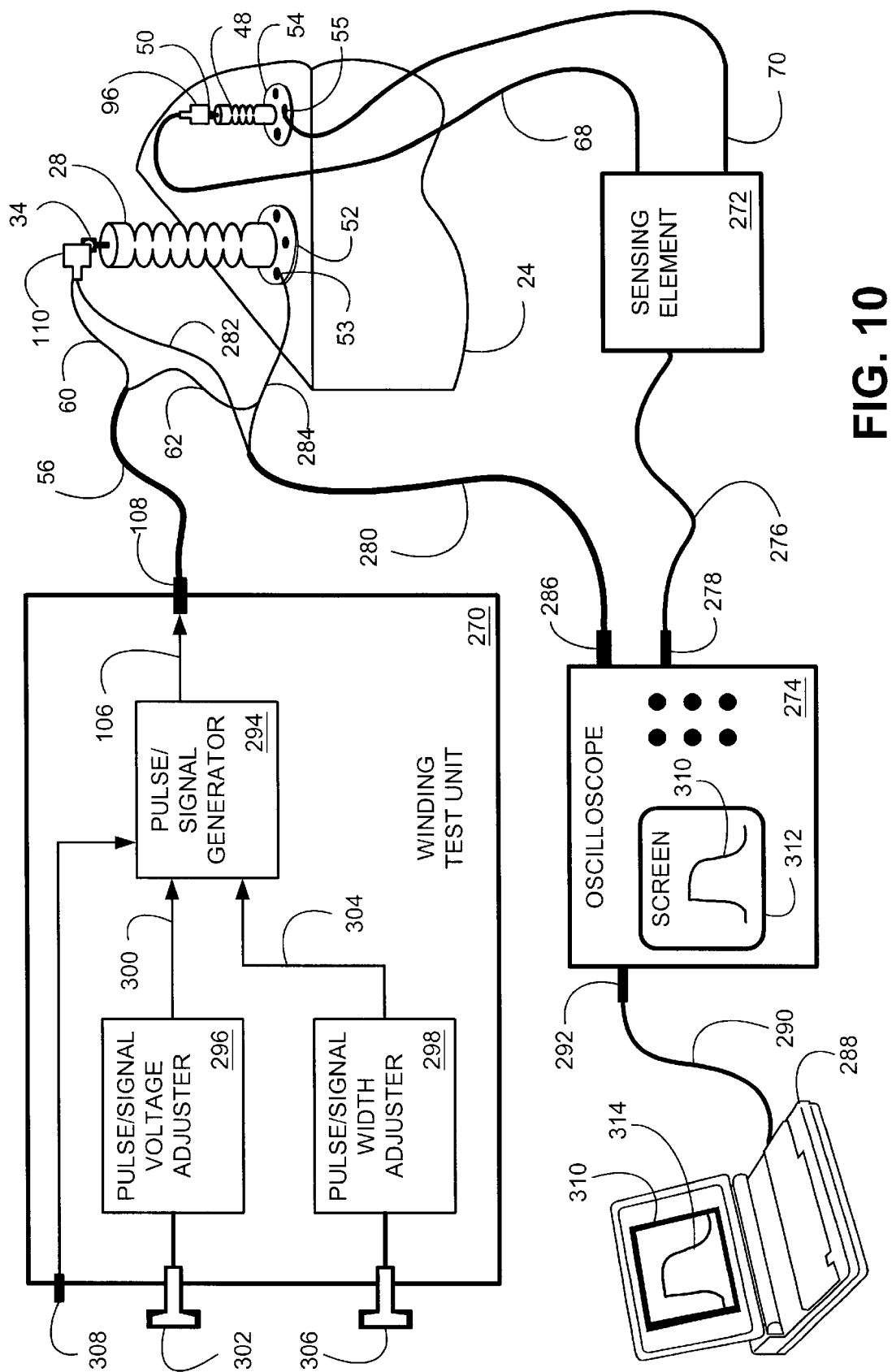
FIG. 10 illustrates an alternative embodiment of the winding test unit and the sensing element coupled to the transformer of FIG. 1.

FIG. 10 illustrates an alternative embodiment of the winding test unit 270 and the sensing element 272 coupled to transformer 24. Winding test unit 270 is coupled to transformer 24 via connection 56. A first connection 60, such as the center conductor of a coaxial cable 56, is coupled to terminal 34, thereby providing connectivity between connection 106 and terminal 34. For convenience, center cable conductor 60 may employ a releasable fastener 110 for attachment to terminal 34, and connection 56 may employ plug-in attachment 108 for convenient coupling to the winding test unit 270.

Oscilloscope 274 is coupled to transformer 24 via connection 280. Like connection 56, connection 280 is a two wire flexible connector, such as, but not limited to, a coaxial cable. A first connection 282, such as the center wire of a coaxial cable, is coupled to terminal 34 at a convenient location. For illustration purposes, connection 282 is shown as coupled to the releasable fastener 110, however connection 282 may be connected to terminal 34 in any suitable manner so long as the input pulse or signal may be adequately detected by oscilloscope 274 through connection 282. Connection 284 is the second conductor, such as the shield wire of a coaxial cable, of connection 280. Connection 284 is coupled to the mounting flange 52 of the high voltage bushing 28, and preferably affixed to a selected mounting bolt 53.

Sensing element 272 is coupled to transformer 22 via connections 68 and 70 in a manner previously described. Sensing element 272 is coupled to oscilloscope 274 via connection 276. For convenience, a plug-in attachment 278, similar to plug-in attachment 108, is used to couple connection 276 to oscilloscope 274.

The oscilloscope 274 is coupled to PC 288 via connection 290. Connection 290 is coupled to oscilloscope 274 with plug-in attachment 292, and is coupled to PC 288 employing a commonly available PC connection coupling device (not shown). Plug-in attachments 278, 286 and 292 are similar to the plug-in attachment 108 described above, however, plug-in attachments 278, 286 and 292 may be appropriately sized and configured for the particular wiring connection to which the plug-in attachment 278, 286 and 292 is attached to. One skilled in the art will appreciate that the above-described connections between winding test unit 270, transformer 24, sensing element 272, oscilloscope 274 and PC 288 may employ any suitable connecting device without departing substantially from the operation and functionality of the present invention. Any such implementation of the components illustrated in FIG. 10 using alternative connections are intended to be within the scope of this disclosure and to be protected by the accompanying claims.

Winding test unit 270 has at least a pulse/signal generator 294, a pulse/signal voltage adjuster 296 and a pulse/signal width adjuster 298. Pulse/signal voltage adjuster 296 is coupled to the pulse/signal generator 294 via connection 300. Testing personnel (not shown) may actuate actuator 302 to adjust the voltage magnitude of the input pulse or signal applied to terminal 34 that is generated by the pulse/signal generator 294. Pulse/signal width adjuster 298 is coupled to the pulse/signal generator 294 via connection 304. Testing personnel may actuate actuator 306 to adjust the width of the input pulse or signal applied to terminal 34 that is generated by the pulse/signal generator 294. The testing personnel may initiate the generation of the input pulse or signal by actuating actuator 308. The components residing in the winding test unit 270 described above may be implemented using similar components used to implement winding test unit 20, and therefore, are not described again in detail herein for convenience. One skilled in the art will appreciate that the above-described elements residing in winding test unit 20 (FIG. 2), and any other alternative devices having equivalent operation and functionality, may be implemented in the winding test unit 270. Any such alternative embodiments of a winding test unit 270 are intended to be within the scope of this disclosure and to be protected by the accompanying claims.

A desirable feature of the embodiment of the winding test unit 270 illustrated in FIG. 10 is that the embodiment functions with one or more commercially available devices. Sensing element 272 may be the same sensing element 22 described above, or may be another suitable sensing device configured to detect the output pulse or signal on terminal 50, and configured to provide a suitable output signal to oscilloscope 274. Oscilloscope 274 is a well known, conventional oscilloscope and is configured to detect the generated pulse or signal applied to terminal 34 via connection 280. Thus, when the testing personnel actuates actuator 308 to generate and apply an input pulse or signal to terminal 34 from the winding test unit 270, the input and output pulses or signals are detected. The testing personnel may view the input and/or output pulses or signals 310 on the oscilloscope screen 312. PC 288 may be configured to concurrently display the input and/or output pulse or signal 310 on computer screen 314.

The embodiment described above and illustrated in FIG. 10 functions and operates substantially similar to the embodiment illustrated in FIG. 2. However, the memory in which the test data (not shown) is stored and the analysis logic (not shown) resides, and the processor (not shown) which analyzes the test data, resides in PC 266. Thus, when the testing personnel initiates the generation of an input pulse or signal that is applied to terminal 34, and the sensing element 272 detects the output pulse or signal on terminal 50, oscilloscope 274 is configured to receive the input and output pulse or signals such that data corresponding to the input and output pulse or signals is transmitted to PC 288.

The alternative embodiment described above and illustrated in FIG. 10 is particularly suitable for an implementation of the present invention that utilizes readily available existing components. Such readily available components may already be owned by the testing personnel (or their employer) and used for other applications. Thus, the embodiment described above and illustrated in FIG. 9 is particularly suited for a smaller and/or more economical embodiment of the present invention. That is, the testing personnel (or their employer) already in possession of sensing elements 272, oscilloscope 274 and PC 288 need only acquire the winding test unit 270 to practice the present invention.

Sensing element 22 (FIG. 2) described above included at least a resistor 78 and a series resistor 100 such that the output pulse or signal at terminal 50 is detected by sensing element 22. Other devices capable of detecting the output pulse at terminal 50 and capable of providing a suitable data signal corresponding to the detected output pulse or signal may be substituted for sensing element 22 in other embodiments without departing substantially from the operation and functionality of the present invention. For example, but not limited to, a current transformer, a transducer or potentiometer may be used to detect the output pulse or signal. Furthermore, the device detecting the output pulse or signal may be a separate multi-purpose device, or part of a separate multipurpose device, that performs other functionalities associated with the energy delivery system. For example, but not limited to, events recorders, protective device sensors, or metering devices may be employed so long as the output pulse or signal is detected with suitable accuracy such that a valid and reliable characteristic signature may be computed.

Actuator 128 (FIG. 2) was manually actuated by the testing personnel to initiate the generation of the input pulse or signal by the pulse/signal generator 80. Other embodiments may employ an automatic means for initiating the generation of the input pulse or signal. For example, but not limited to, a timer, a clock, a processor, or other periodic signal generating device could be employed in other embodiments to initiate the generation of the input pulse or signal. Furthermore, the periodic pulses generated by the automatic device may generate periodic pulses equally spaced apart in time, or may generate randomly timed pulses.

Figure 11:
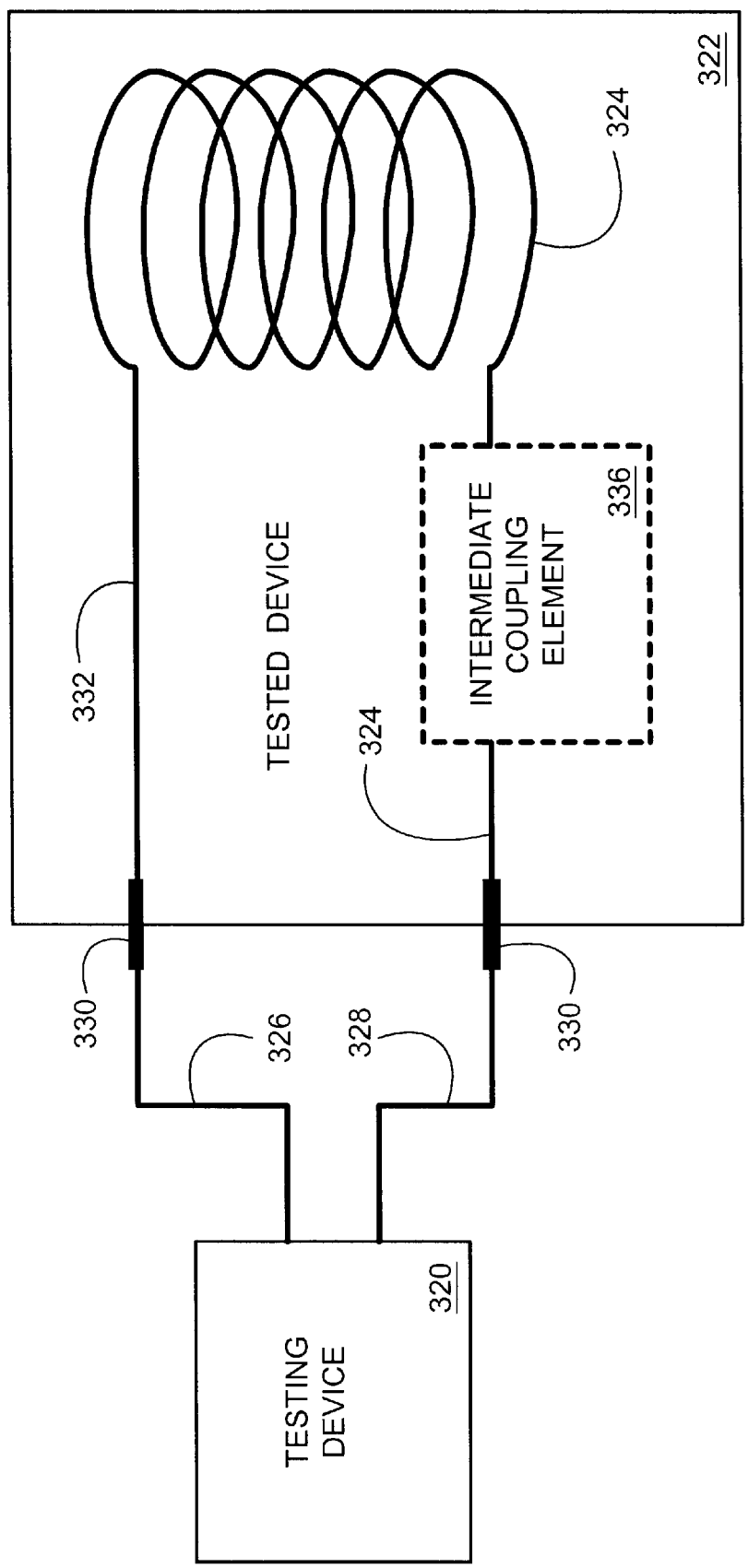
FIG. 11 illustrates an alternative embodiment of a testing unit coupled to a tested device having a winding that is to be tested for deformation or displacement.

The above-described embodiments of the winding test unit 20 are described as an apparatus and method for determining a valid and reliable characteristic signature of the transformer windings residing in transformer 24. FIG. 11 illustrates an alternative embodiment of a testing unit 320 coupled to a tested device 322 having at least one winding 324 that is to be tested for deformation or displacement. Testing device 320 is coupled to tested device 322 via connections 326 and 328. Suitable plug-in attachments 330 enable convenient coupling of connections 326 and 328 to connections 332 and 334, respectively.

Connection 332 is coupled to winding 324 such that an input pulse or signal generated by testing device 320 may be applied to the winding 324, via connections 328 and 332. A suitable output pulse or signal is detected by testing device 320 on connection 338. Testing device 320 generates an input pulse or signal through winding 324 and detects an output pulse or signal to derive a characteristic signature for winding 324. Thus, testing device 320 is configured in accordance with any of the above-described embodiments of the winding test unit 20 (FIGS. 1 and 2) and/or winding test unit 270 (FIG. 10). For convenience of illustration, a sensing unit (not shown) is assumed to reside within testing device 320. However, such a sensing device (not shown) could reside outside of the testing device 320 as a stand-alone unit, or may be incorporated as part of a different multi-purpose device. Such alternative embodiments of the sensing element have been described above and are equally applicable to the embodiment illustrated in FIG. 11.

An intermediate coupling element 336 is shown residing within the tested device 322. Intermediate coupling element 336 may or may not be present depending upon the specific nature of the tested device 322. If the intermediate coupling element 336 is not present in the tested device 322, connection 334 would be directly coupled to winding 324.

Tested device 322 may be any device that employs a current carrying or voltage carrying winding as one of its elements. One example of such a tested device 322 is a generator. Generators are commonly employed in the energy delivery system to generate electricity. Generators employ a plurality of windings coupled to the rotor and the stator. Thus, testing device 320 may be used to compute a characteristic signature of the winding(s) residing in the generator such that winding deformations or displacements may be detected. Another example of tested device 322 is the phase shifting transformer. Phase shifting transformers are devices employed in the energy delivery system to control the flow of power through an individual transmission line or a group of transmission lines. A phase shifting transformer is constructed similar to a transformer, however, the phase shifting transformer is configured slightly differently such that control of power flow is achieved rather than the transformation of voltages. Another example of a tested device 322 having a winding is the voltage regulator. Voltage regulators are employed in an energy delivery system to automatically regulate voltage at a specific point in the energy delivery system. Another example of a tested device 322 includes some types of motors. Many motors employ windings such that when the motor windings are energized, the motor shaft is rotated so that the motor may perform a particular task or function. Simple devices such as potential transformers or current transformers employed in the energy delivery system to provide suitable inputs to current and voltage measuring devices may also be tested by testing device 320. The above-described examples of the tested device 322 are intended to demonstrate a few of the many devices that employ windings that may be tested by testing device 320. Any such embodiments of a testing device 320 configured to operate and function in accordance with the present invention are intended to be included within the scope of this disclosure and to be protected by the following claims.

Often, the tested device 322 will be constructed and configured such that connection 334 may not be directly coupled to the winding 324. For example, a second winding (not shown) may be electro-magnetically coupled to winding 324 such that the applied input pulse or signal from the testing device 320 propagates through winding 324 and through the second winding (not shown). The second winding may provide a convenient connection 334 such that a suitable output pulse or signal may be detected. Thus, the input pulse or signal applied to winding 324 also propagates through the second winding and is detected on connection 334. Here, the characteristic signature determined by testing device 320 would be a characteristic signature that includes aspects of winding 324 and aspects of the second winding. Changes in the characteristic signal over time may indicate a deformation or displacement in winding 324 and/or the second winding. Thus, one skilled in the art will appreciate that testing device 320 may be particularly suited to detecting deformation or displacement in the windings of very complex devices. Any such embodiment of testing device 320 is intended to be included within the scope of this disclosure and to be protected by the accompanying claims.

The embodiment illustrated in FIG. 2 employed a pulse/signal generator 80 coupled to terminal 34 of high voltage bushing 28 via connection 56, and a signal recorder 82 coupled to terminal 34 via connection 58 such that the signal recorder 82 detects the input pulse or signal generated by the pulse/signal generator 80. An alternative embodiment may employ an optional signal detector coupled to the system at a convenient location, such as to connection 106 of FIG. 2, such that the optional signal detector provides data corresponding to the detected input pulse or signal generated by pulse/signal generator 80 to the signal recorder 82. Another embodiment employs an optional signal detector configured to directly provide a signal to signal recorder 82. Furthermore, a similar embodiment employing an optional signal detector could be configured to provide a data signal corresponding to the detected input pulse or signal generated by the pulse/signal generator 80 directly to the test data storage area 92 residing in memory 90. Any such alternative embodiment as described above is intended to be included within the scope of this disclosure and to be protected by the accompanying claims.

The embodiment of the winding test unit 20 illustrated in FIG. 2 employed a pulse/signal voltage adjuster 86 such that the input pulse or signal generated by the pulse/signal generator 80 could have an adjustable voltage. An alternative embodiment employs a pulse/signal current adjuster coupled to the pulse/signal generator 80 such that the current magnitude of the input pulse or signal generated by the pulse/signal generator 80 is adjustable. Such an embodiment would be particularly suitable when the pulse/signal generator 80 was configured as a current source generating a current pulse or signal. Any such alternative embodiment employing a pulse/signal current adjuster is intended to be included within the scope of this disclosure and to be protected the accompanying claims.

An alternative embodiment applies a test pulse or signal to other types of electrical apparatus that do not employ windings, and computes a characteristic signature according the process of the present invention. For example, such an embodiment is particularly suitable to detecting structural changes in lightning arrestors, capacitors, bushings and the like. Changes in characteristic signatures for such devices developed according to the present invention provide a useful predictive maintenance tool.

It should be emphasized that the above-described "embodiments" of the winding test unit, particularly, any "preferred" embodiments, are merely possible examples of implementations, merely set forth for a clear understanding of the principles of the winding test unit. Many variations and modifications may be made to the above-described embodiment(s) of the winding test unit without departing substantially from the spirit and principles of the winding test unit. All such modifications and variations are intended to be included herein within the scope of the winding test unit, and be protected by the claims that follow.

What is claimed is:

1. A system for testing a winding, comprising:
    a signal generator, the signal generator configured to generate a plurality of input signals that are applied to the winding;
    an input signal sensor configured to detect the plurality of input signals applied to the winding;
    an output signal sensor configured to detect a plurality of output signals, each one of the output signals corresponding to one of the input signals after each of the input signals have propagated through the winding;
    a processor communicatively coupled to the signal generator and to the sensor, the processor programmed to perform the steps of:
        computing for each one of the plurality of input signals an auto-spectral density ($G_{xx}$) based upon a frequency response X(f) of each input signal;
        computing a cross-spectral density ($G_{xy}$) based upon the frequency response X(f) of each input signal and a frequency response Y(f) of the associated output signal of the plurality of output signals; and
        computing the characteristic signature [H(f)] for the winding based upon $G_{xy}$ and $G_{xx}$ for pairs of associated input and output signals.

2. The system of claim 1, further comprising:
    a means for recording signals, the recording signal means coupled to the input signal sensor and output signal sensor, and configured to receive a first signal from the input signal sensor and to receive a second signal from the output signal sensor, and further configured to generate a first data signal corresponding to the first signal and a second data signal corresponding to the second signal; and
    a memory coupled to the processor and the recording signal means, the memory configured to store the first data signal and the second data signal, and further configured to provide the first data signal and the second data signal to the processor when the processor executes a logic module to compute the characteristic signature.

3. The system of claim 1, the processor further comprising a means for generating an output signal, the output signal generating means configured to output a signal to an output device for reporting to a user the characteristic signature.

4. The system of claim 3, wherein the output device is a screen.

5. The system of claim 3, wherein the output device is a printer.

6. The system of claim 1, further comprising a means for adjusting each one of the plurality of input signals, the means for adjusting coupled to the signal generator and having an input control means so that a user may selectively adjust at least one parameter of each of the generated input signals.

7. The system of claim 6, wherein the means for adjusting adjusts a width of each one of the input signals.

8. The system of claim 6, wherein the means for adjusting adjusts a magnitude of each one of the input signals.

9. A method for testing a winding, the method comprising the steps of:
    communicating a plurality of signals through the winding;
    computing for each one of the plurality of signals an auto-spectral density ($G_{xx}$) based upon a frequency response X(f) of the signal before the signal is communicated through the winding;
    computing for each one of the plurality of signals a cross-spectral density ($G_{xy}$) based upon the frequency response X(f) of the signal before the signal is communicated through the winding and a frequency response Y(f) of the signal after the signal is communicated through the winding; and
    computing a characteristic signature [H(f)] for the winding based upon $G_{xy}$ and $G_{xx}$ for the plurality of signals.

10. The method of claim 9, further comprising the steps of:

computing for each one of the plurality of signals an auto-spectral density ($G_{yy}$) based upon the frequency response Y(f) of the signal after the signal is communicated through the winding;

computing a coherence function [$\gamma^2_{xy}$]; and analyzing the coherence function $\gamma^2_{xy}$ such that the reliability and validity of the characteristic signature H(f) for the winding can be determined.

11. The method of claim 10, further comprising the steps of:

computing an error function ($E_r$); and analyzing the error function $E_r$ such that the reliability and validity of the characteristic signature H(f) for the winding can be determined.

12. The method of claim 10, further comprising the step of comparing the characteristic signature H(f) for the winding with a second characteristic signature H(f) for the winding, the second characteristic signature H(f) being computed at an earlier time, such that differences between the characteristic signature H(f) for the winding and the second characteristic signature H(f) indicate a deformation of at least a portion of the winding.

13. The method of claim 10, further comprising the step of comparing the characteristic signature H(f) for the winding with a second characteristic signature H(f) for the winding, the second characteristic signature H(f) being computed at an earlier time, such that differences between the characteristic signature H(f) for the winding and the second characteristic signature H(f) indicate a displacement of at least a portion of winding.

14. The method of claim 9, further comprising the step of adjusting each one of the plurality of signals communicated through the winding.

15. The method of claim 14, wherein the step of adjusting adjusts a width of each one of the plurality of signals communicated through the winding.

16. The method of claim 14, wherein the step of adjusting adjusts a magnitude of each one of the plurality of signals communicated through the winding.

17. A method for testing a winding, the method comprising the steps of:

applying an input signal to the winding;

detecting the input signal;

detecting an output signal from the winding, the output signal resulting from a propagation of the input signal through the winding;

associating the input signal and the output signal to identify a signal pair;

determining an input signal frequency response [X(f)] for the input signal;

determining an output signal frequency response [Y(f)] for the output signal;

computing an input signal auto-spectral density ($G_{xx}$) for the input signal frequency response X(f);

computing a cross-spectral density ($G_{xy}$) from the input signal frequency response X(f) and the output signal frequency response Y(f);

repeating a plurality of times the steps of: applying the input signal, detecting the input signal, detecting the output signal, associating the input signal and the output signal to identify the signal pair, determining X(f), determining Y(f), computing $G_{xx}$, and computing $G_{xy}$; and computing a characteristic signature [H(f)] for the winding based upon an average of $G_{xy}$ and $G_{xx}$ for the signal pairs.

18. The method of claim 17, wherein the steps of determining the frequency response for the input signal and determining the frequency response for the output signal are determined by computing a fast Fourier transform (FFT) for the input signal and the output signal.

19. The method of claim 17, wherein the step of computing the input signal auto-spectral density $G_{xx}$ for the input signal frequency response X(f) is determined by computing a complex conjugate such that $G_{xx}=X(f)^*X(f)$.

20. The method of claim 17, wherein the step of computing the cross-spectral density $G_{xy}$ from the input signal frequency response X(f) and the output signal frequency response Y(f) is determined by computing a first complex conjugate such that $G_{xy}=X(f)^*Y(f)$.

21. The method of claim 17, further comprising the steps of:

computing an output signal auto-spectral density ($G_{yy}$) for the output signal frequency response Y(f);

computing a coherence function [$\gamma^2_{xy}$]; and analyzing the coherence function $\gamma^2_{xy}$ such that the reliability and validity of the characteristic signature H(f) for the winding can be determined.

22. The method of claim 21, wherein the step of computing the output signal auto-spectral density $G_{yy}$ for the output signal frequency response Y(f) is determined by computing a second complex conjugate such that $G_{yy}=Y(f)^*Y(f)$.

23. The method of claim 21, wherein the step of computing the coherence function $\gamma^2_{xy}$ is determined by squaring the magnitude of $G_{xy}$ and dividing by a product of $G_{xx}$ and $G_{yy}$, such that $\gamma^2_{xy}=|G_{xy}|^2/G_{xx}G_{yy}$.

24. The method of claim 21, further comprising the steps of:

computing an error function ($E_r$); and analyzing the error function $E_r$ such that the reliability and validity of the characteristic signature H(f) for the winding can be determined.

25. The method of claim 24, wherein the step of computing the error function $E_r$ is determined such that $E_r=[1-\gamma^2_{xy}(f)]^{1/2}/|\gamma_{xy}(f)|(2n_d)^{1/2}$.

26. The method of claim 17, further comprising the step of adjusting at least one parameter of each one of the input signals applied to the winding.

27. The method of claim 26, wherein the step of adjusting adjusts a width of each one of the input signals applied to the winding.

28. The method of claim 26, wherein the step of adjusting adjusts a magnitude of each one of the input signals applied to the winding.

29. The method of claim 26, further comprising means for adjusting at least one parameter of each one of the plurality of signals communicated through the winding.

30. The method of claim 26, wherein the means for adjusting adjusts a width of each one of the plurality of signals communicated through the winding.

31. The method of claim 26, wherein the means for adjusting adjusts a magnitude of each one of the plurality of signals communicated through the winding.

32. A system for testing a winding, comprising:

means for communicating a plurality of signals through the winding;

means for computing for each one of the plurality of signals an auto-spectral density ($G_{xx}$) based upon a frequency response X(f) of the signal before the signal is communicated through the winding;

means for computing for each one of the plurality of signals a cross-spectral density ($G_{xy}$) based upon a frequency response Y(f) of the signal after the signal is communicated through the winding; and means for computing a characteristic signature [H(f)] for the winding based upon an average of $G_{xy}$ and $G_{xx}$ for the plurality of signals.

33. The system of claim 32, further comprising:

means for computing for each one of the plurality of signals an auto-spectral density ($G_{yy}$) based upon a frequency response Y(f) of the signal after the signal is communicated through the winding;

means for computing a coherence function [$\gamma^2_{xy}$]; and means for analyzing the coherence function $\gamma^2_{xy}$, such that the reliability and validity of the characteristic signature H(f) for the winding can be determined.

34. The system of claim 33, further comprising:

means for computing an error function ($E_r$); and means for analyzing the error function $E_r$, such that the reliability and validity of the characteristic signature H(f) for the winding can be determined.

35. The system of claim 32, further comprising a means for generating an output signal, the output signal generating means configured to output a signal to an output device for reporting to a user the characteristic signature.

36. A computer readable medium having a program for determining a characteristic signature of a winding, the program comprising logic configured to perform the steps of:

computing for each one of a plurality of signals communicated through the winding an auto-spectral density ($G_{xx}$) based upon a frequency response X(f) of the signal before the signal is communicated through the winding;

computing for each one of the plurality of signals a cross-spectral density ($G_{xy}$) based upon a frequency response Y(f) of the signal after the signal is communicated through the winding; and computing a characteristic signature [H(f)] for the winding based upon an average of $G_{xy}$ and $G_{xx}$ for the plurality of signals.

37. The system of claim 36, the logic further configured to perform the steps of:

computing for each one of the plurality of signals an auto-spectral density ($G_{yy}$) based upon a frequency response Y(f) of the signal after the signal is communicated through the winding;

computing a coherence function [$\gamma^2_{xy}$]; and analyzing the coherence function $\gamma^2_{xy}$, such that the reliability and validity of the characteristic signature H(f) for the winding can be determined.

38. The system of claim 37, the logic further configured to perform the steps of:

computing an error function ($E_r$); and analyzing the error function $E_r$ such that the reliability and validity of the characteristic signature H(f) for the winding can be determined.

* * * * *

UNITED STATES PATENT AND TRADEMARK OFFICE
CERTIFICATE OF CORRECTION

PATENT NO. : 6,369,582 B2
DATED : April 9, 2002
INVENTOR(S) : Coffeen

It is certified that error appears in the above-identified patent and that said Letters Patent is hereby corrected as shown below:

Title page,
Item [56], OTHER PUBLICATIONS, delete the phrase in the second reference "Example of State-Of-The-Art Public Doman, February 22, 2000, Substation Equipment Diag." and substitute therefor -- Example of State-Of-The-Art Public Domain, February 22, 2000, Substation Equipment Diag. --.

Column 2,
Line 11, after the word "voltage" delete the word "than".

Column 6,
Line 13, after the phrase "H(f)" delete the word "is".
Line 29, delete the equation "$\gamma^2_{xy}(f)=|G_{xy}(f)^2/G_{xx}(f)G_{yy}(f)$" and substitute therefor -- $\gamma^2_{xy}(f)=|G_{xy}(f)|^2/G_{xx}(f)G_{yy}(f)$ --.

Column 7,
Line 13, after the word "such" add the word -- as --.

Column 8,
Line 36, after the word "portion" add the word -- of --.

Column 12,
Line 55, after the "of" delete the word "a".

Column 13,
Line 48, after the numeral "80" add the word -- to --.

Column 14,
Line 7, after the word "or" delete the word "a" and substitute therefor the word -- an --.

UNITED STATES PATENT AND TRADEMARK OFFICE
CERTIFICATE OF CORRECTION

PATENT NO. : 6,369,582 B1
DATED : April 9, 2002
INVENTOR(S) : Coffeen

It is certified that error appears in the above-identified patent and that said Letters Patent is hereby corrected as shown below:

<u>Column 20,</u>
Lines 22-23, after the word "indicate" delete the word "a".

<u>Column 31,</u>
Lines 43-44, after the word "according" add the word -- to --.

Signed and Sealed this

Thirty-first Day of December, 2002

JAMES E. ROGAN
*Director of the United States Patent and Trademark Office*